(12) United States Patent
Nakamura

(10) Patent No.: US 11,784,147 B2
(45) Date of Patent: *Oct. 10, 2023

(54) SEMICONDUCTOR DEVICE AND MANUFACTURING METHOD OF SEMICONDUCTOR DEVICE

(71) Applicant: SONY SEMICONDUCTOR SOLUTIONS CORPORATION, Kanagawa (JP)

(72) Inventor: Takuya Nakamura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/499,166

(22) Filed: Oct. 12, 2021

(65) Prior Publication Data

US 2022/0139853 A1 May 5, 2022

Related U.S. Application Data

(63) Continuation of application No. 16/765,332, filed as application No. PCT/JP2018/039008 on Oct. 19, 2018, now Pat. No. 11,183,472.

(30) Foreign Application Priority Data

Nov. 28, 2017 (JP) .................................. 2017-227414

(51) Int. Cl.
    *H01L 23/00* (2006.01)
    *H01L 27/146* (2006.01)

(52) U.S. Cl.
    CPC .............. *H01L 24/05* (2013.01); *H01L 24/03* (2013.01); *H01L 27/1462* (2013.01);
(Continued)

(58) Field of Classification Search
    CPC ..... H01L 24/05; H01L 24/03; H01L 27/1462; H01L 27/14636; H01L 2224/05011;
(Continued)

(56) References Cited

U.S. PATENT DOCUMENTS 7,868,453 B2  1/2011 Daubenspeck et al.
8,508,051 B2  8/2013 Nagai et al.
(Continued)

FOREIGN PATENT DOCUMENTS

CN  108140628 A  6/2018
JP  2011-054670 A  3/2011
(Continued)

OTHER PUBLICATIONS

International Search Report and Written Opinion of PCT Application No. PCT/JP2018/039008, dated Nov. 27, 2018, 08 pages of English Translation and 07 pages of ISRWO.
(Continued)

*Primary Examiner* — Douglas W Owens
(74) *Attorney, Agent, or Firm* — CHIP LAW GROUP

(57) ABSTRACT

A semiconductor device includes a pad, a diffusion layer, and a melting layer. The pad included by the semiconductor device includes a concave portion on a surface at which solder connection is to be performed. The diffusion layer included by the semiconductor device is disposed at the concave portion and constituted with a metal which remains on the surface of the pad while diffusing into solder upon the solder connection. The melting layer included by the semiconductor device is disposed adjacent to the diffusion layer and constituted with a metal which diffuses and melts into the solder upon the solder connection.

11 Claims, 19 Drawing Sheets

(52) U.S. Cl.
CPC .. *H01L 27/14636* (2013.01); *H01L 27/14685* (2013.01); *H01L 2224/05011* (2013.01); *H01L 2224/05576* (2013.01); *H01L 2924/01013* (2013.01); *H01L 2924/01029* (2013.01)

(58) Field of Classification Search
CPC ........... H01L 2224/05576; H01L 24/13; H01L 2224/0239; H01L 24/16; H01L 24/81; H01L 2224/05017; H01L 2224/05557; H01L 2224/1607; H01L 2224/16147; H01L 2224/16501; H01L 2224/05018
See application file for complete search history.

(56) References Cited

U.S. PATENT DOCUMENTS

| | | | | |
|---|---|---|---|---|
| 11,183,472 | B2 * | 11/2021 | Nakamura | ........ H01L 27/14609 |
| 2004/0238955 | A1 | 12/2004 | Homma et al. | |
| 2006/0030139 | A1 | 2/2006 | Mis et al. | |
| 2008/0169539 | A1 | 7/2008 | Fang et al. | |
| 2010/0258950 | A1 | 10/2010 | Li et al. | |
| 2013/0181341 | A1 | 7/2013 | Yu | |
| 2016/0225729 | A1 * | 8/2016 | Chen | ........................ H01L 24/05 |
| 2016/0284656 | A1 | 9/2016 | Rinck et al. | |
| 2017/0287859 | A1 * | 10/2017 | Harano | ............... H01L 23/3171 |
| 2020/0035631 | A1 | 1/2020 | Chang | |

FOREIGN PATENT DOCUMENTS

| | | |
|---|---|---|
| JP | 2011-198796 A | 10/2011 |
| JP | 2017-079281 A | 4/2017 |
| KR | 20100123840 A | 11/2010 |
| KR | 10-2018-0070554 A | 6/2018 |
| TW | 201725710 A | 7/2017 |
| WO | 2017/068997 A1 | 4/2017 |
| WO | 2017/1068997 A1 | 4/2017 |

OTHER PUBLICATIONS

International Preliminary Report on Patentability of PCT Application No. PCT/JP2018/039008, dated Jun. 11, 2020, 08 pages of English Translation and 04 pages of IPRP.

* cited by examiner

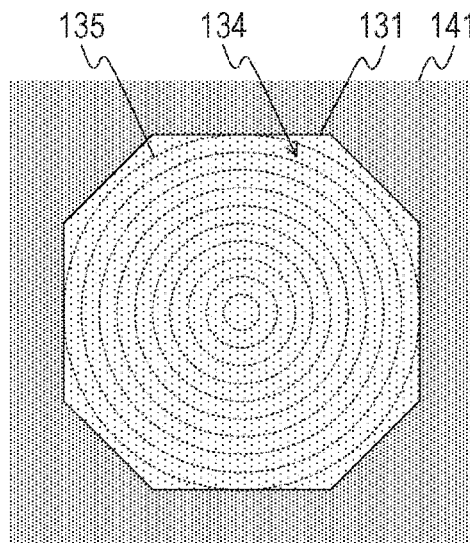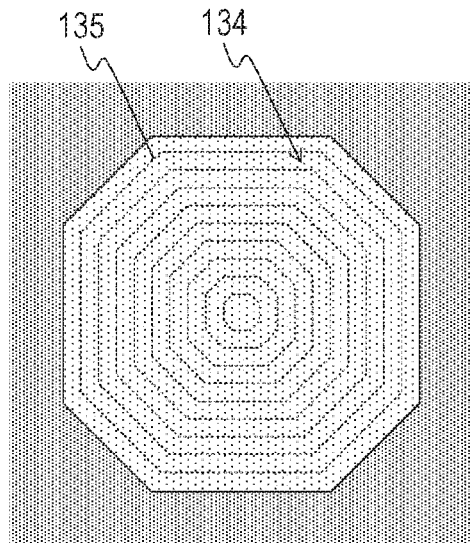
FIG. 14A  FIG. 14B
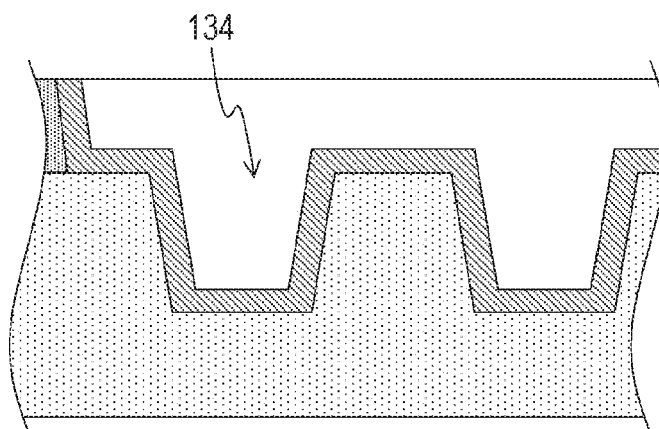
FIG. 14C
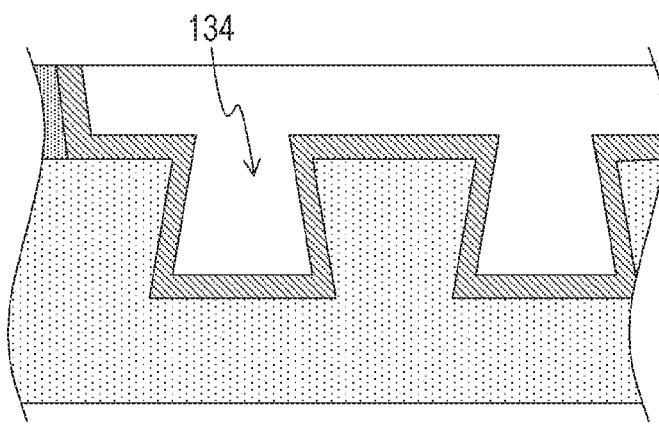
FIG. 14D

SEMICONDUCTOR DEVICE AND MANUFACTURING METHOD OF SEMICONDUCTOR DEVICE

CROSS REFERENCE TO RELATED APPLICATIONS

The present application is a continuous application of U.S. patent application Ser. No. 16/765,332, filed on May 19, 2020, which is a national stage entry of PCT application No. PCT/JP2018/039008 filed on Oct. 19, 2018, which claims priority benefit of Japanese Patent Application No. JP 2017-227414 filed in the Japan Patent Office on Nov. 28, 2017. Each of the above-referenced applications is hereby incorporated herein by reference in its entirety.

TECHNICAL FIELD

The present technology relates to a semiconductor device and a manufacturing method of a semiconductor device. More particularly, the present technology relates to a semiconductor device including a pad at which solder connection is to be performed, and a manufacturing method of a semiconductor device.

BACKGROUND ART

In related art, a semiconductor device in which a plurality of semiconductor chips is laminated and implemented has been used. For example, a semiconductor device in which a second semiconductor chip is implemented on a first semiconductor chip is used. In this semiconductor device, the first semiconductor chip is electrically connected to the second semiconductor chip by tin (Sn)-based solder. A microbump is formed by solder on a rear surface of the second semiconductor chip. Meanwhile, a bump pad in a concave shape which is fitted to the microbump of the second semiconductor chip is formed on a surface of the first semiconductor chip. At a bottom portion of the bump pad, a metal in which a first metal layer (barrier metal), a second metal layer of cobalt (Co), and a third metal layer of copper (Cu) are sequentially laminated on a pad of aluminum (Al), is disposed. By reflow soldering being performed while the first and the second semiconductor chips are positioned at positions where the microbump faces the bump pad, the microbump is bonded to the metal disposed at the bump pad. By this means, the second semiconductor chip is implemented on the first semiconductor chip (see, for example, Patent Document 1).

CITATION LIST

Patent Document

Patent Document 1: Japanese Patent Application Laid-Open No. 2017-079281

SUMMARY OF THE INVENTION

Problems to be Solved by the Invention

In the above-described related art, there is a problem that strength of a solder connection portion after implementation is low. In accordance with reduction in a size of a semiconductor chip, increase in connection portions in association with increase of signal lines, or the like, in recent years, a pad to be formed on a semiconductor chip becomes smaller. In a case where a pad becomes smaller in this manner, because the solder connection portion becomes smaller, there is a problem that strength of the solder connection portion becomes lower in the above-described related art.

The present technology has been made in view of the above-described problem, and is directed to improving solder connection strength even in a case where a pad becomes smaller.

Solutions to Problems

The present technology has been made in view of the above-described problem, and according to a first aspect of the present technology, there is provided a semiconductor device including a pad including a concave portion on a surface, and at which solder connection is to be performed, a diffusion layer disposed at the concave portion and constituted with a metal which remains on the surface of the pad while diffusing into solder upon the solder connection, and a melting layer disposed adjacent to the diffusion layer and constituted with a metal which diffuses and melts into the solder upon the solder connection. By this means, action is provided that a diffusion layer remains between the pad and the solder even after a melting layer at a concave portion of the pad melts into the solder upon solder connection. Here, diffusion corresponds to intrusion into the solder and formation of an alloy with the solder. The melting layer is replaced with the solder at the concave portion of the pad while contact between the pad and the solder is prevented, and introduction of the solder into the concave portion of the pad is expected.

Further, in this first aspect, a diffusion prevention layer disposed between the pad and the diffusion layer described above and constituted with a metal which prevents diffusion of the pad into the solder upon the solder connection is further included, and the diffusion layer may remain on a surface of the diffusion prevention layer upon the solder connection. By this means, action is provided that diffusion of the pad within the solder upon solder connection is prevented.

Further, in this first aspect, the pad described above may include a plurality of the concave portions constituted in a linear shape. By this means, action is provided that the concave portion of the pad is constituted with a plurality of grooves. Increase in a connection area for solder connection is expected.

Further, in this first aspect, the pad described above may be constituted with aluminum. By this means, action is provided that solder connection is performed with the pad constituted with aluminum.

Further, in this first aspect, the pad described above may be constituted with copper. By this means, action is provided that solder connection is performed with the pad constituted with copper.

Further, in this first aspect, the diffusion layer described above may be constituted with cobalt. By this means, action is provided that the diffusion layer constituted with cobalt remains on a surface of the pad while diffusing within the solder upon solder connection.

Further, in this first aspect, the melting layer described above may be constituted such that a plane different from a plane adjacent to the diffusion layer described above, has a flat planar shape. By this means, action is provided that a surface which contacts the solder upon solder connection is planarized. Uniform contact between the solder and the melting layer is expected.

Further, according to a second aspect of the present technology, there is provided a manufacturing method of a semiconductor device including a concave portion forming step of forming a concave portion on a surface of a pad at which solder connection is to be performed, a diffusion layer forming step of forming a diffusion layer constituted with a metal which remains on the surface of the pad while diffusing into solder upon the solder connection, at the formed concave portion, and a melting layer forming step of forming a melting layer constituted with a metal which diffuses and melts into the solder upon the solder connection, adjacent to the formed diffusion layer. Action is provided that the melting layer at the concave portion of the pad melts into the solder upon solder connection, and a semiconductor device in which the diffusion layer remains between the pad and the solder is manufactured. The melting layer is replaced with the solder at the concave portion of the pad while contact between the pad and the solder is prevented, and introduction of the solder into the concave portion is expected.

Effects of the Invention

The semiconductor device according to the present technology provides an excellent effect that connection strength in solder connection is improved.

BRIEF DESCRIPTION OF DRAWINGS

FIGS. 14A, 14B, 14C, and 14D are diagrams illustrating a configuration example of a pad according to a modified example of the embodiments of the present technology.

MODE FOR CARRYING OUT THE INVENTION

Figure 1:
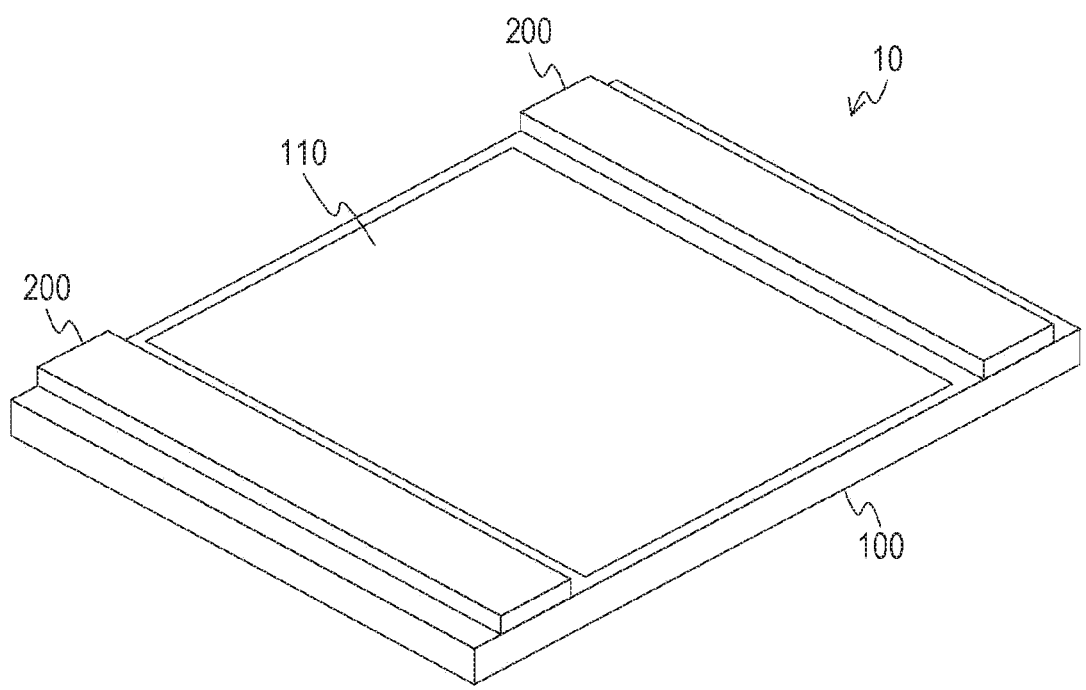
FIG. 1 is a diagram illustrating a configuration example of a semiconductor device according to a first embodiment of the present technology.

Next, a mode for implementing the present technology (hereinafter referred to as an embodiment) will be described with reference to the drawings. In the following drawings, the same or similar reference signs are attached to the same or similar portions. However, the drawings are schematic, and ratios of dimensions of each unit and the like do not necessarily match the actual ones. In addition, of course, the drawings also include portions having different dimensional relationships and ratios. In addition, the description of the embodiments will be given in the following sequence.
1. First Embodiment
2. Second Embodiment
3. Third Embodiment
4. Modified examples
5. Application example to imaging device
6. Application example to endoscopic surgery system
7. Application example to mobile object 1. First Embodiment Configuration Example of Semiconductor Device FIG. 1 is a diagram illustrating a configuration example of a semiconductor device according to a first embodiment of the present technology. FIG. 1 is a diagram illustrating a configuration example of a semiconductor device 10. This semiconductor device 10 is an imaging device having an imaging function of converting light from a subject into an image signal. The semiconductor device according to the first embodiment of the present technology will be described using an example of this imaging device. The semiconductor device 10 includes a pixel chip 100 and a signal processing chip 200.

The pixel chip 100 is a semiconductor chip in which pixels which generate image signals in accordance with radiated light are arranged in a two-dimensional grid shape. These pixels are arranged in a pixel array unit 110 in FIG. 1. If light from the subject is focused on the pixel array unit 110 via an imaging lens, an image signal in accordance with the subject is generated for each pixel and output. The pixel includes a photoelectric conversion unit which generates an electric charge in accordance with the radiated light, and a pixel circuit which generates an image signal on the basis of the electric charge generated by the photoelectric conversion unit.

The signal processing chip 200 is a semiconductor chip which processes the image signal generated by the pixel of the pixel chip 100. This signal processing chip 200 performs, for example, analog-digital conversion of converting the analog image signal generated by the pixel into a digital image signal, as signal processing. Thereafter, the digital image signal is output for each frame which is an image signal corresponding to one screen. Further, the signal processing chip 200 generates a pixel control signal for controlling generation of the image signal at the pixel on the basis of a control signal input from outside of the semiconductor device 10 and supplies the pixel control signal to the pixel chip 100.

The signal processing chips 200 are respectively disposed along sides which face each other, of a surface on which the pixel array unit 110 is disposed at the pixel chip 100. Specifically, the signal processing chip 200 is implemented on the pixel chip 100 through solder connection. The above-described control signal is input once to the pixel chip 100 from an image processing device, or the like, outside the semiconductor device 10, and transmitted to the signal processing chip 200 through solder connection. The pixel control signal based on the control signal is generated at the signal processing chip 200, transmitted again to the pixel chip 100 through solder connection, and input to each pixel of the pixel array unit 110. Meanwhile, the image signal generated by the pixel of the pixel array unit 110 is transmitted to the signal processing chip 200 through solder connection. This transmitted image signal is subjected to signal processing at the signal processing chip 200, transmitted again to the pixel chip 100 through solder connection, and output to an image processing device outside the semiconductor device 10 from the pixel chip 100.

Configuration Example of Semiconductor Device

Figure 2:
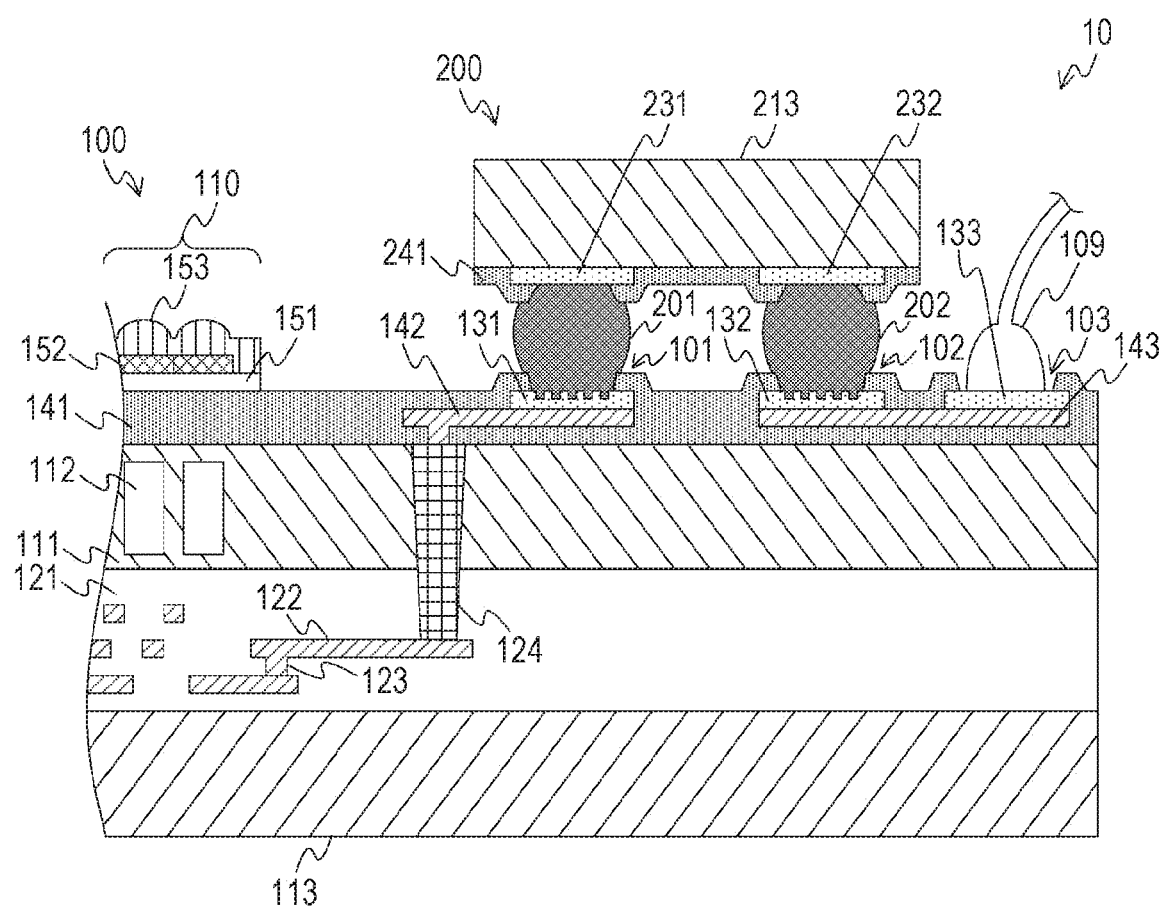
FIG. 2 is a diagram illustrating a configuration example of a semiconductor device according to the first embodiment of the present technology.

FIG. 2 is a diagram illustrating a configuration example of a semiconductor device according to the first embodiment of the present technology. FIG. 2 is a cross-sectional diagram schematically illustrating a configuration example of the semiconductor device 10. The pixel chip 100 in FIG. 2 includes a semiconductor substrate 111, insulating layers 121 and 141, wiring layers 122, 142 and 143, pads 131 to 133, a planarizing film 151, a color filter 152, an on-chip lens 153 and a support substrate 113.

The semiconductor substrate 111 is a semiconductor substrate on which a photoelectric conversion unit of the pixel of the pixel array unit 110 and a semiconductor portion of the pixel circuit are formed. FIG. 2 illustrates the photoelectric conversion unit as an example. A region 112 in FIG. 2 is a semiconductor region formed in a diffusion region of the semiconductor substrate 111, and is a region where a photodiode which operates as the photoelectric conversion unit is formed. The on-chip lens 153 is a lens which focuses light from a subject to the above-described photoelectric conversion unit. The color filter 152 is an optical filter which transmits light of a predetermined wavelength among the light focused by the on-chip lens 153. The planarizing film 151 planarizes a surface on which the color filter 152 is to be formed to make a film thickness of the color filter 152 uniform. The pixel chip 100 in FIG. 2 corresponds to a rear surface irradiation type imaging element in which the on-chip lens 153, or the like, are disposed on a rear surface of the semiconductor substrate 111. The image signal is generated at the pixel on the basis of the light radiated from the rear surface of the semiconductor substrate 111, and transmitted by a wiring layer 122 disposed on a surface of the semiconductor substrate 111. Note that the support substrate 113 is a substrate which is disposed on a surface of the semiconductor substrate 111 on which the insulating layer 121 and the wiring layer 122 are formed, and which supports the semiconductor substrate 111 upon processing on a rear surface side of the semiconductor substrate 111 or upon formation of the color filter 152, or the like.

The wiring layers 122, 142 and 143 are wirings which transmit the image signal, the pixel control signal, or the like. Further, the insulating layers 121 and 141 insulate the wiring layer 122, or the like. The wiring layer 122 and the insulating layer 121 are disposed on a surface side of the semiconductor substrate 111, and the wiring layers 142 and 143 and the insulating layer 141 are disposed on the rear surface side of the semiconductor substrate 111. Further, the wiring layer 122, or the like, can be a multilayer wiring. FIG. 2 illustrates an example where the wiring layer 122 is constituted to have three layers. The wiring layers 122 formed in different layers can be connected with via plugs 123. Note that the wiring layer 122 is connected to the wiring layer 142 with a via plug 124. This via plug 124 is a via plug formed to penetrate through the semiconductor substrate 111, and is referred to as a through silicon via (TSV). The wiring layer 122, or the like, can be constituted with a metal such as, for example, Cu. The insulating layers 121 and 141 can be constituted with an insulator of, for example, silicon oxide ($SiO_2$), or the like.

The pads 131 to 133 transmit signals to circuits outside the pixel chip 100. Specifically, the pads 131 and 132 transmit signals to the signal processing chip 200. As illustrated in FIG. 2, the pad 131 is solder-connected to the pad 132 using solder bumps 201 and 202 which will be described later. Meanwhile, the pad 133 transmits signals to a lead frame, or the like, disposed outside the pixel chip 100. As illustrated in FIG. 2, at the pad 133, signals are transmitted via a bonding wire 109. The pads 131 to 133 are solder-connected, or the like, via openings 101 to 103 formed in the insulating layer 141. These pads 131 to 133 can be constituted with a metal such as, for example, Al. Note that, as will be described later, a concave portion 134 is formed on surfaces of the pads 131 and 132, and an underlaying metal (the diffusion layer 136 and the melting layer 137) for solder connection is laminated.

The signal processing chip 200 includes a semiconductor substrate 213, pads 231 and 232, an insulating layer 241, and solder bumps 201 and 202. The solder bumps 201 and 202 are respectively formed at the pads 231 and 232.

The solder bumps 201 and 202 are bumps constituted with solder. The solder bumps 201 and 202 are respectively solder-connected to the pads 131 and 132 of the pixel chip 100 when the signal processing chip 200 is implemented on the pixel chip 100. As the solder bumps 201 and 202, for example, Sn-based solder can be used. Here, Sn-based solder corresponds to solder in which silver (Ag), bismuth (Bi), Cu, indium (In), or the like, are added to Sn. Specifically, the solder corresponds to SnAg-based, SnBi-based, SnCu-based, SnIn-based and SnAgCu-based solder. Solder connection can be performed by disposing the signal processing chip 200 so as to face the pixel chip 100 while positioning the solder bumps 201 and 202 and the pads 131 and 132, and performing reflow soldering. Note that description of the semiconductor substrate, the wiring layer, or the like, at the signal processing chip 200 has been omitted.

In FIG. 2, a signal flow path will be described using an example of an image signal. The image signal generated at the pixel array unit 110 is transmitted to a processing circuit of the signal processing chip 200 by way of the wiring layer 122, the via plug 124, the wiring layer 142, the pad 131, the solder bump 201 and the pad 231. Thereafter, the image signal processed by the processing circuit of the signal processing chip 200 is output to outside of the pixel chip 100 by way of the pad 232, the solder bump 202, the pad 132, the wiring layer 143, the pad 133 and the bonding wire 109.

[Configuration of Pad Portion]

Figure 3A:
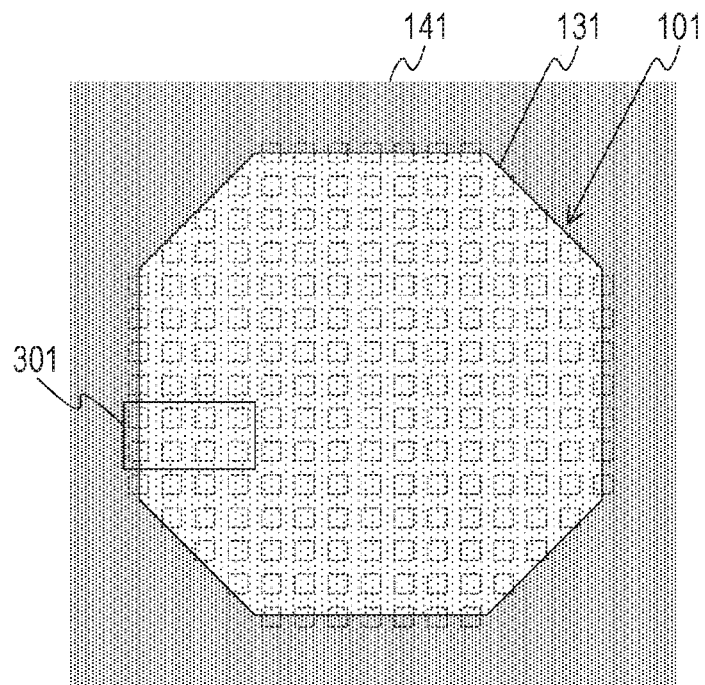
FIGS. 3A and 3B are diagrams illustrating a configuration example of a pad according to the first embodiment of the present technology.
Figure 3B:
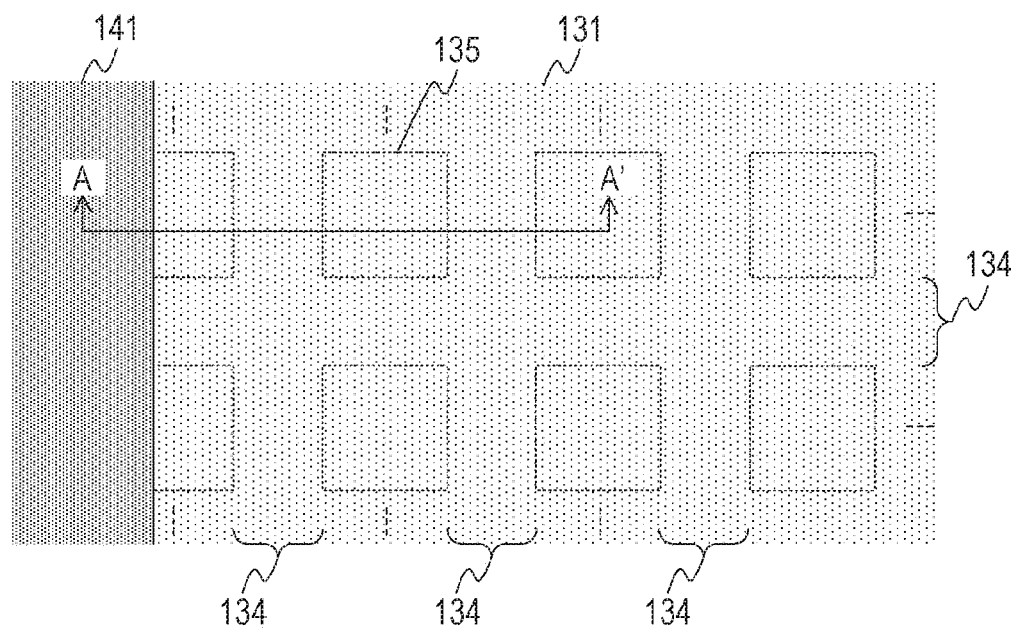

FIGS. 3A and 3B are diagrams illustrating a configuration example of a pad according to the first embodiment of the present technology. FIGS. 3A and 3B are top views illustrating a configuration of the pad 131. The configuration of the pad will be described using an example of the pad 131. FIG. 3A illustrates a configuration of a surface of the pad 131 at the opening 101 formed in the insulating layer 141 described in FIG. 2. Note that the opening 101 in FIGS. 3A and 3B are constituted in an octagon shape, and solder connection is performed at this opening. Therefore, a shape of the opening 101 corresponds to a shape of the pad 131 relating to solder connection.

A concave portion is formed on the surface of the pad 131. Rectangles indicated with a dashed line in FIGS. 3A and 3B are rectangles indicating a boundary 135 of the concave portion of the pad 131. FIG. 3B is an enlarged view of the pad 131 in FIG. 3A, and is a diagram illustrating a region 301 in FIG. 3A. In FIG. 3B, a region outside the boundary 135 indicates the concave portion 134 of the pad 131. FIGS. 3A and 3B illustrate an example where a plurality of concave portions constituted in a linear shape is arranged. That is, the concave portion 134 in FIGS. 3A and 3B indicate an example where a plurality of linear concave portions is arranged longitudinally and transversely and formed in a net shape.

Figure 4:
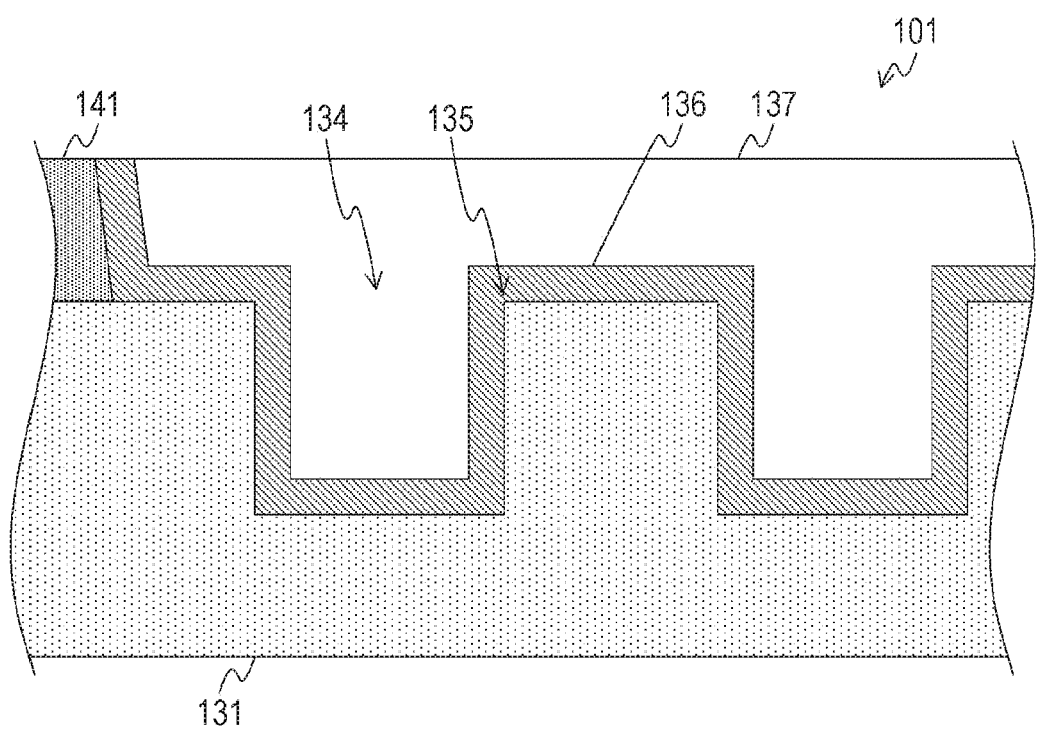
FIG. 4 is a diagram illustrating a configuration example of a pad according to the first embodiment of the present technology.

FIG. 4 is a diagram illustrating a configuration example of the pad according to the first embodiment of the present technology. FIG. 4 is a cross-sectional diagram illustrating the configuration of the pad 131, and is a diagram illustrating a cross-section along a line A-A' in FIG. 3B. As illustrated in FIGS. 3A and 3B, the concave portion 134 is formed on the surface of the pad 131. Further, the diffusion layer 136 and the melting layer 137 are sequentially disposed adjacent to the pad 131 including this concave portion 134. That is, these diffusion layer 136 and melting layer 137 are disposed at the concave portion 134. Upon solder connection, a molten solder bump 201 contacts the melting layer 137. Note that a width and a depth of the concave portion 134 can be set at, for example, several hundred nm to several μm.

The diffusion layer 136 and the melting layer 137 can be both constituted with a metal which diffuses within the solder bump 201 upon solder connection with the solder bump 201. The melting layer 137 diffuses and melts into the solder bump 201 upon solder connection. That is, the melting layer 137 widely diffuses within the solder bump 201, and substantially disappears from the surface of the pad 131 after the solder connection. Meanwhile, an amount of diffusion of the diffusion layer 136 into the solder bump 201 is less than that of the melting layer 137, and the diffusion layer 136 remains on the surface of the pad 131 even after the solder connection.

As described above in FIG. 2, the pad 131 can be constituted with Al. Because this Al diffuses into the solder which constitutes the solder bump 201, or the like, upon solder connection, a thickness of the pad 131 is reduced after the solder connection, and strength in the solder connection is lowered. Therefore, by disposing the diffusion layer 136 which remains on the surface of the pad 131 even after the solder connection between the pad 131 and molten solder upon solder connection, it is possible to prevent contact between the pad 131 and the molten solder, so that it is possible to prevent diffusion of the pad 131 into the solder bump 201. Further, because a small amount of the diffusion layer 136 diffuses into the solder bump 201 and forms an alloy, it is possible to improve adhesion strength with the solder bump 201, or the like.

In contrast, the melting layer 137 diffuses and disappears while forming an alloy between the melting layer 137 and the solder upon solder connection as described above. Therefore, the state becomes a state where a region of the melting layer 137 illustrated in FIG. 2 is replaced with molten solder. Even in such a case, contact between the pad 131 and the molten solder is prevented by the above-described action of the diffusion layer 136. After the solder connection, the state becomes a state where solder which constitutes the solder bump 201 is disposed at the concave portion 134 formed on the surface of the pad 131. That is, the state becomes a state where solder which constitutes the solder bump 201, or the like, is introduced into the concave portion 134 by the melting layer 137. Because a bonding area between the solder bump 201, or the like, and the pad 131 increases, it is possible to improve strength of the solder connection. Further, because the concave portion 134 exists at the solder connection portion, it is also possible to improve strength against stress in a horizontal direction.

Further, as illustrated in FIG. 4, by constituting the surface of the melting layer 137 to have a flat surface, it is possible to improve strength in soldering. This is because the molten solder uniformly contacts the melting layer 137, so that it is possible to prevent occurrence of a void at an interface between the molten solder bumps 201 and 202 and the melting layer 137.

As the melting layer 137, for example, Cu and nickel (Ni) can be used. Further, as the diffusion layer 136, for example, Co, gold (Au) and platinum (Pt) can be used. Among these, because Co less diffuses to Sn-based solder, if Co is applied as the diffusion layer 136, it is possible to make a film thickness of the diffusion layer 136 thinner. Therefore, it is possible to form the diffusion layer 136 through wafer process. Further, by employing Cu as the melting layer 137, it is possible to also form the melting layer 137 through wafer process. Note that Ni can be also applied as the diffusion layer 136. In this event, Cu is employed as the melting layer 137.

[Solder Connection]

Figure 5A:
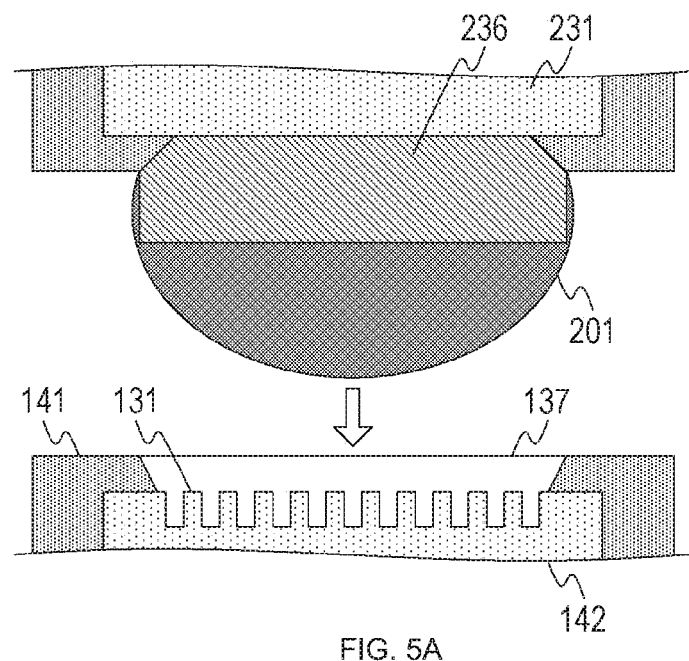
FIGS. 5A, 5B, and 5C are diagrams illustrating an example of solder connection according to the first embodiment of the present technology.
Figure 5B:
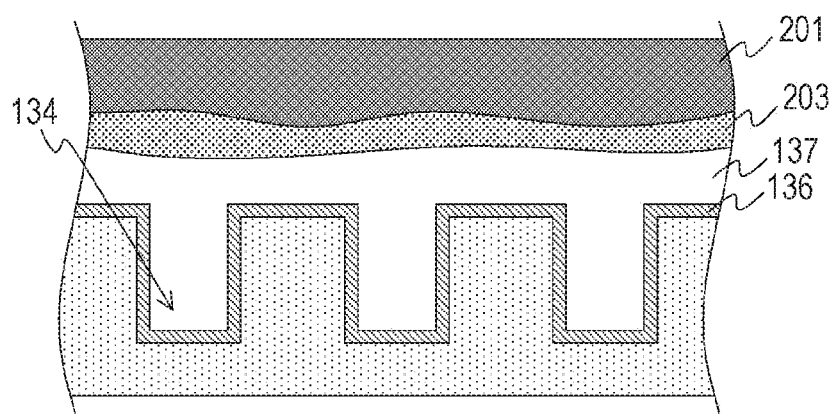
Figure 5C:
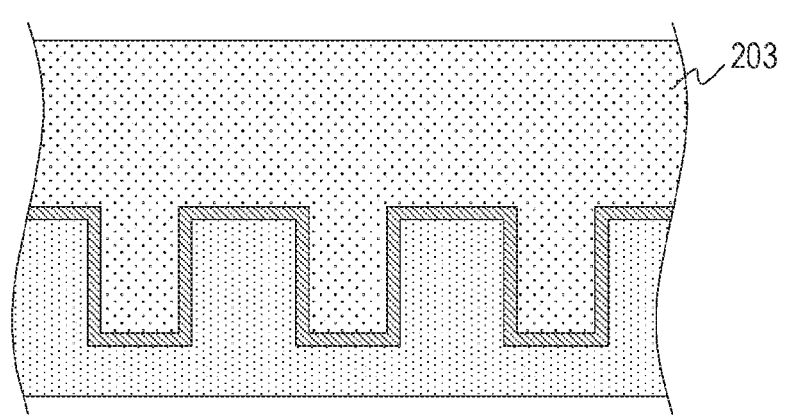

FIGS. 5A, 5B, and 5C are diagrams illustrating an example of solder connection according to the first embodiment of the present technology. FIG. 5A is a diagram for explaining aspect of solder connection. As indicated with an outline arrow in FIG. 5A, the solder bump 201 is positioned on and contacts the surface of the pad 131, and reflow soldering is performed. FIG. 5B is a diagram illustrating aspect of a bonding portion in an initial stage of soldering, and is a diagram illustrating a state where the solder bump 201 which is molten by reflow soldering contacts the melting layer 137. The molten solder bump 201 contacts the melting layer 137, and the melting layer 137 diffuses into the solder bump 201, thereby an alloy layer 203 is formed at an interface of the solder bump 201 and the melting layer 137. This alloy layer 203 grows in accordance with diffusion of the melting layer 137. At the same time, the melting layer 137 gradually disappears. After solder connection, the diffusion layer 136 which has been disposed at the concave portion 134 is replaced with solder or the alloy layer 203. FIG. 5C is a diagram illustrating aspect of a bonding portion after the solder connection, and is a diagram illustrating a state where the alloy layer 203 is introduced into the concave portion 134.

Note that also at the pad 231 of the signal processing chip 200, a metal layer 236 as an underlying metal is disposed. By forming a layer of solder on this metal layer 236, and cooling the layer of the solder after melting the layer of the solder by reflow furnace, or the like, it is possible to form a solder bump 201 in a semisphere shape. As the metal layer 236, Ni can be used. Ni has characteristics that an amount of diffusion into solder is larger than that of Co described above. Therefore, by increasing a film thickness of the metal layer 236 using Ni, it is possible to cause the metal layer 236 to remain on a surface of the pad 231 after solder connection. However, there is a problem that, because concavities and convexities by the metal layer 236 occur on the surface of the signal processing chip 200, the metal layer 236 using Ni cannot be applied to a semiconductor device having a step of forming the color filter 152, or the like, like a pixel chip 100.

[Manufacturing Method of Pad Portion]

Figure 6A:
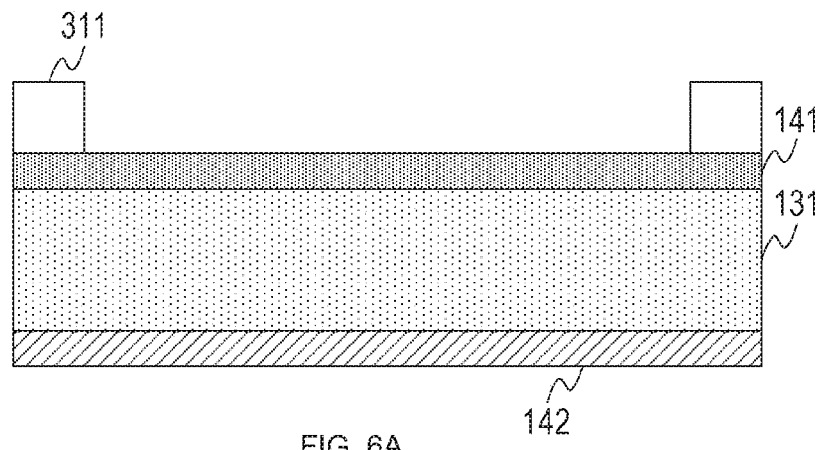
FIGS. 6A, 6B, 6C, and 6D are diagrams illustrating an example of a manufacturing method of a pad according to the first embodiment of the present technology.
Figure 6B:
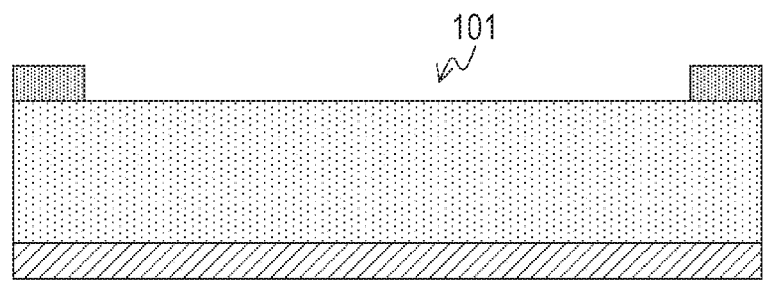
Figure 6C:
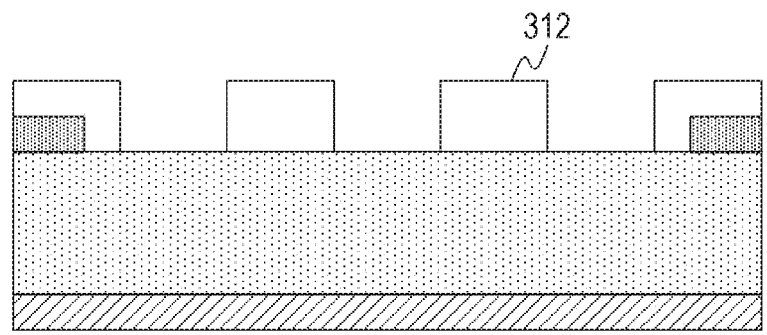
Figure 6D:
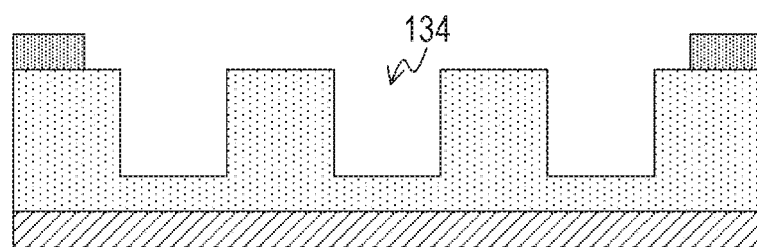

FIGS. 6A, 6B, 6C, 6D, 7A, 7B, and 7C are diagrams illustrating an example of a manufacturing method of the pad according to the first embodiment of the present technology. The manufacturing process of the pad 131 will be described using FIGS. 6A, 6B, 6C, 6D, 7A, 7B, and 7C. In the semiconductor substrate 111 on which the insulating layer 121, the wiring layer 122 and the support substrate 113 are disposed on its surface, and the insulating layer 141, the wiring layer 142 and the pad 131 are disposed on its rear surface, a resist 311 is formed on a surface of the insulating layer 141. This resist 311 is formed in a shape of the opening 101 through photolithography (FIG. 6A). Then, dry etching is performed on the insulating layer 141, and the resist 311 is removed after etching. By this means, the opening 101 is formed in the insulating layer 141 (FIG. 6B). Then, a resist 312 having a shape of the concave portion 134 is formed (FIG. 6C). Then, dry etching and removal of the resist 312 are sequentially performed on the pad 131. By this means, the concave portion 134 is formed on the surface of the pad 131 (FIG. 6D). This step corresponds to a concave portion forming step recited in the claims.

Figure 7A:
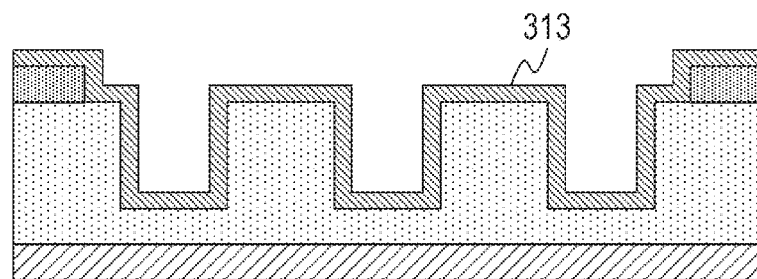
FIGS. 7A, 7B, and 7C are diagrams illustrating an example of a manufacturing method of a pad according to the first embodiment of the present technology.
Figure 7B:
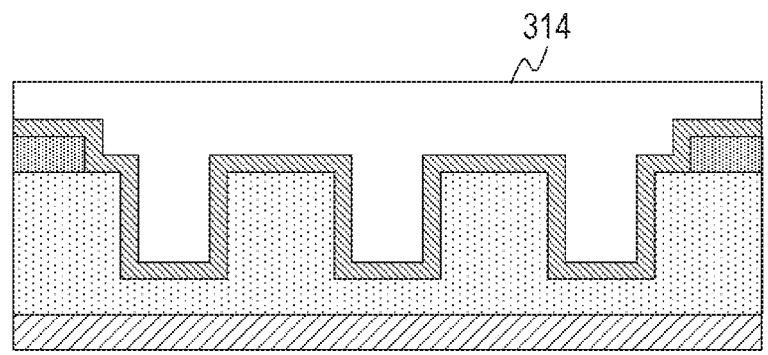
Figure 7C:
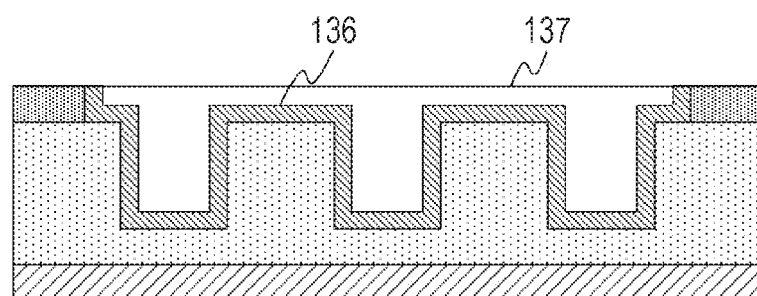

Then, a metal film 313 constituting the diffusion layer 136 is formed (FIG. 7A). This metal film 313 can be formed through sputtering. This step corresponds to a diffusion layer forming step recited in the claims. Then, a metal film 314 constituting the melting layer 137 is formed (FIG. 7B). This metal film 314 can be formed by forming a seed layer through sputtering and performing electrolytic plating. This step corresponds to a melting layer forming step recited in the claims. Finally, chemical mechanical polishing (CMP) is performed to planarize a surface of the melting layer 137 and remove the diffusion layer 136 and the melting layer 137 disposed in a region other than the opening 101 (FIG. 7C). By this means, it is possible to manufacture the pad 131 in which the diffusion layer 136 and the melting layer 137 are disposed at the concave portion 134. Further, it is possible to form the diffusion layer 136 and the melting layer 137 through wafer process.

[Other Manufacturing Method of Pad Portion]

Figure 8A:
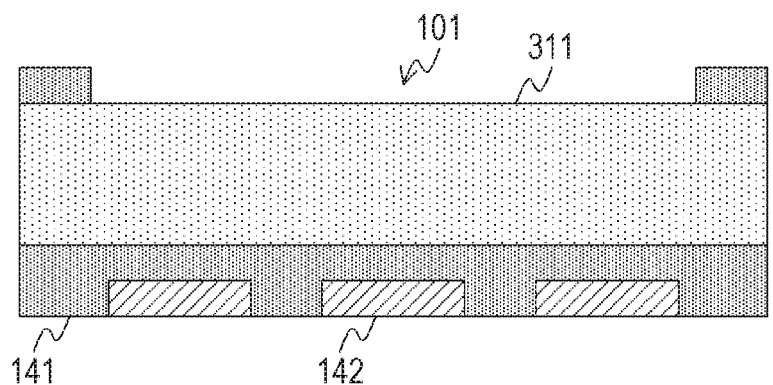
FIGS. 8A, 8B, and 8C are diagrams illustrating another example of the manufacturing method of the pad according to the first embodiment of the present technology.
Figure 8B:
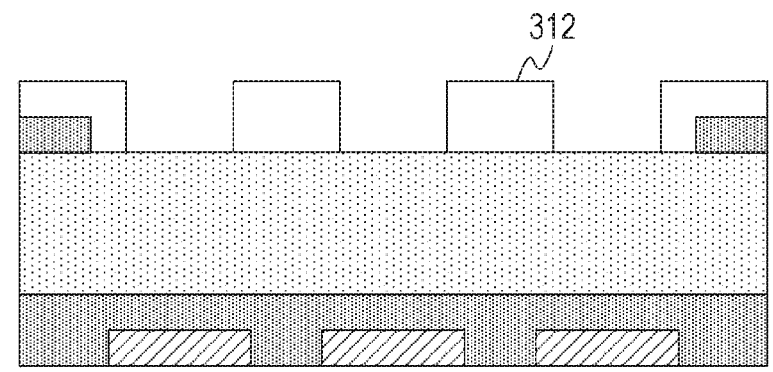
Figure 8C:
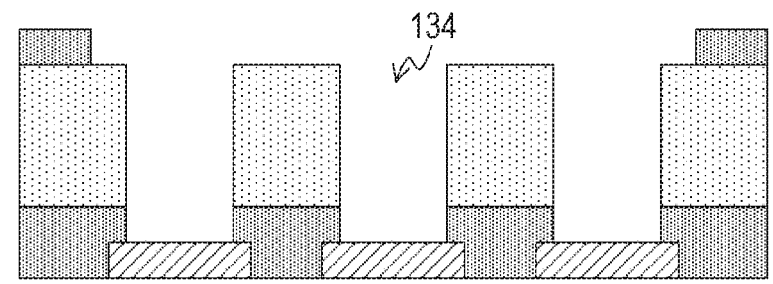

FIGS. 8A, 8B, and 8C are diagrams illustrating another example of the manufacturing method of the pad according to the first embodiment of the present technology. The semiconductor substrate 111 in FIGS. 8A, 8B, and 8C are different from the semiconductor substrate 111 described above in that the wiring layer 142 is constituted in a shape similar to that of the concave portion 134. In a similar manner to the manufacturing method described in FIGS. 6A, 6B, 6C, and 6D, the opening 101 is formed in the insulating layer 141 (FIG. 8A), and the resist 312 is formed (FIG. 8B). Then, in a similar manner to FIG. 6D, dry etching is performed (FIG. 8C). In this event, the wiring layer 142 is used as a stopper layer in dry etching. By this means, it is possible to simplify setting of a dry etching condition.

As described above, in the semiconductor device 10 in the first embodiment of the present technology, by forming the concave portion 134 at the pad 131 and disposing the diffusion layer 136 and the melting layer 137 at this concave portion 134, it is possible to improve solder connection strength.

2. Second Embodiment

In the semiconductor device 10 in the above-described first embodiment, the pad 131 constituted with Al is used. In contrast, the semiconductor device 10 in a second embodiment of the present technology is different from the semiconductor device 10 in the first embodiment in that the pad 131 constituted with Cu is used.

[Configuration of Pad Portion]

Figure 9:
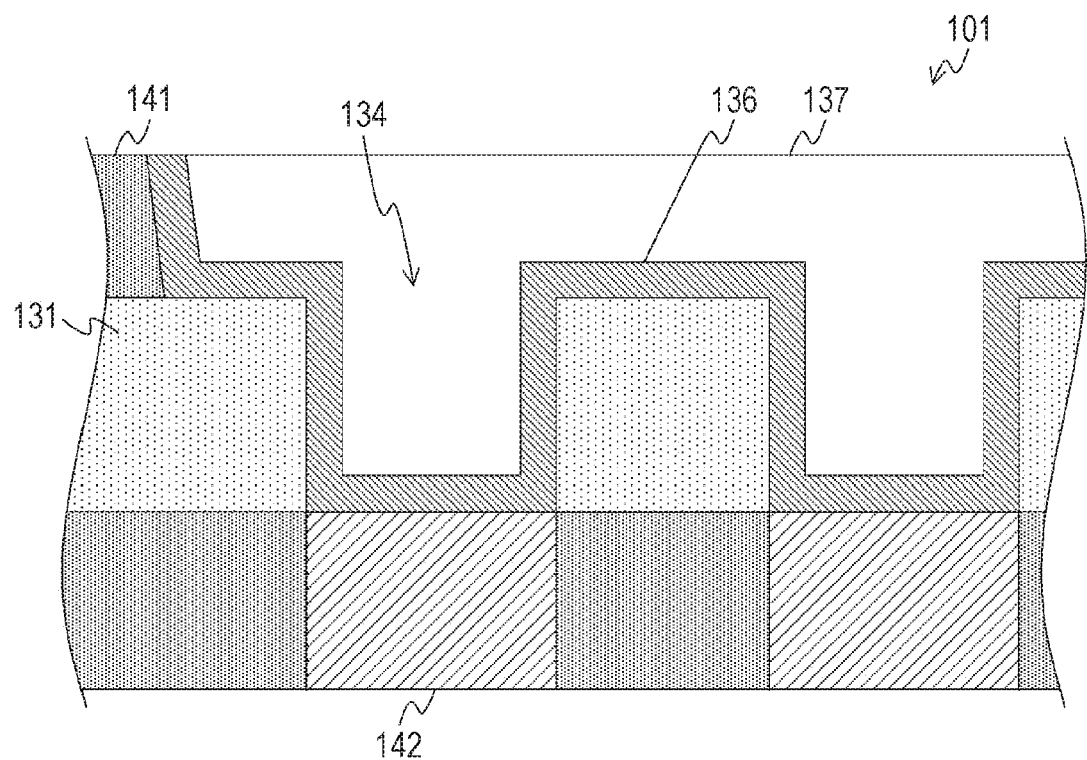
FIG. 9 is a diagram illustrating a configuration example of a pad according to a second embodiment of the present technology.

FIG. 9 is a diagram illustrating a configuration example of a pad according to a second embodiment of the present technology. FIG. 9 is a cross-sectional diagram illustrating a configuration of the pad 131. The pad 131 in FIG. 9 is different from the pad 131 described in FIG. 4 in the following points. The pad 131 in FIG. 9 is constituted with Cu in a similar manner to the wiring layer 142. Further, the wiring layer 142 in FIG. 9 is constituted in the same shape as that of the concave portion 134 of the pad 131, specifically, constituted in a net shape.

[Manufacturing Method of Pad Portion]

Figure 10A:
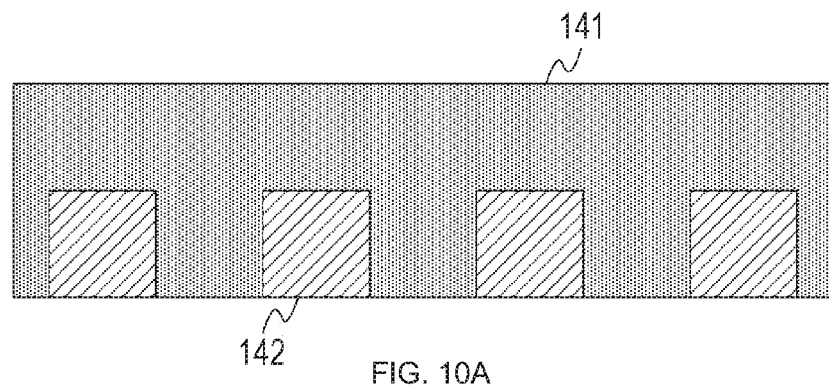
FIGS. 10A, 10B, 10C, and 10D are diagrams illustrating an example of a manufacturing method of a pad according to the second embodiment of the present technology.
Figure 10B:
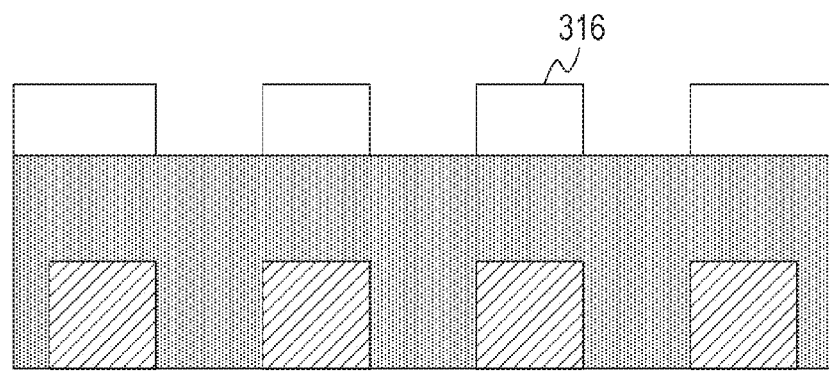
Figure 10C:
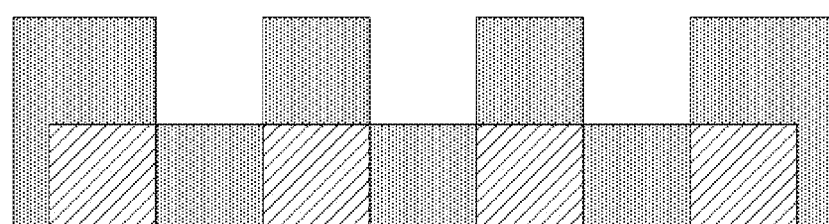
Figure 10D:
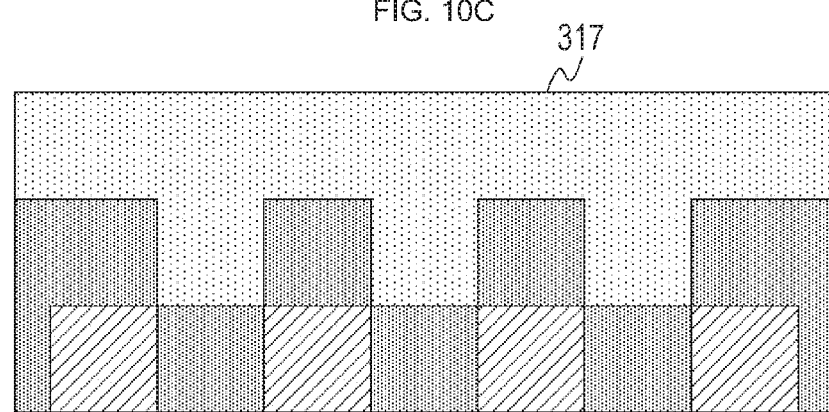
Figure 11A:
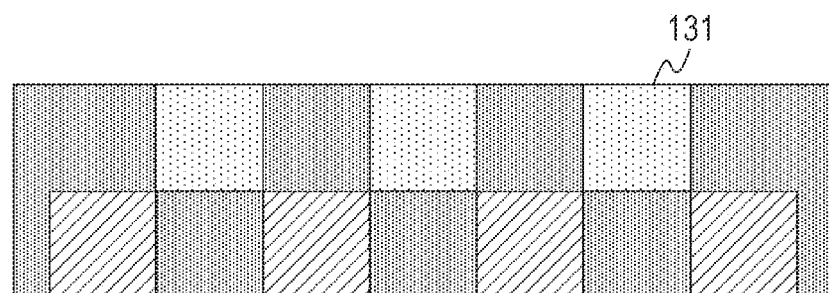
FIGS. 11A-11C are diagrams illustrating an example of a manufacturing method of a pad according to the second embodiment of the present technology.
Figure 11B:
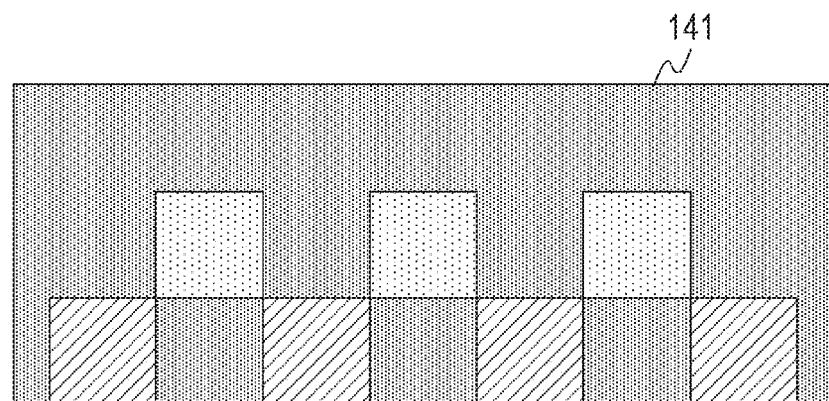

FIGS. 10A, 10B, 10C, 10D, 11A, 11B, 11C, 12A, 12B, and 12C are diagrams illustrating an example of the manufacturing method of the pad according to the second embodiment of the present technology. FIGS. 10A, 10B, 10C, 10D, 11A, 11B, 11C, 12A, 12B, and 12C are diagrams illustrating a manufacturing process of the wiring layer 142 and the pad 131. First, the wiring layer 142 is formed inside the insulating layer 141. This can be formed, for example, by forming a metal film (Cu) which becomes a material of the wiring layer 142 on the insulating layer 141 through plating and performing patterning, and further laminating the insulating layer 141 (FIG. 10A). Then, a resist 316 is formed on the insulating layer 141. This resist 316 is constituted to have a shape of a pattern inverse to that of the concave portion 134 (FIG. 10B). Then, the insulating layer 141 is etched through dry etching (FIG. 10C). Then, the metal film 317 constituted with Cu is formed through plating (FIG. 10D). Then, the surface is ground through CMP, and the pad 131 is formed (FIG. 11A).

Figure 11C:
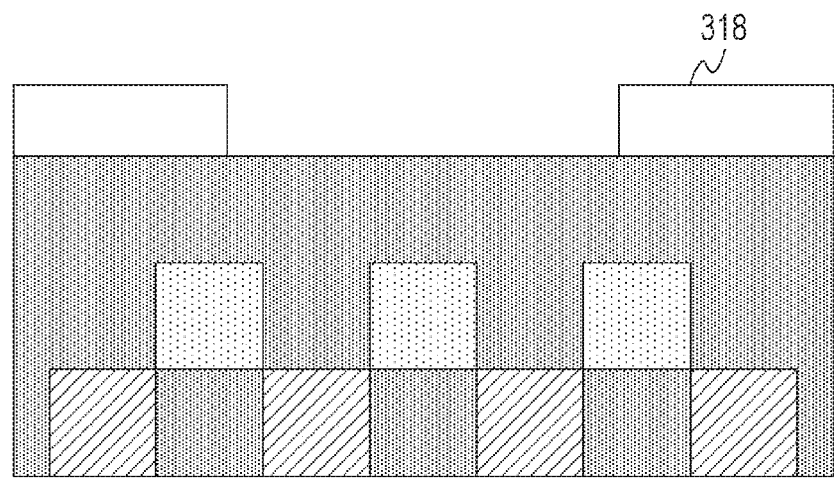
Figure 12A:
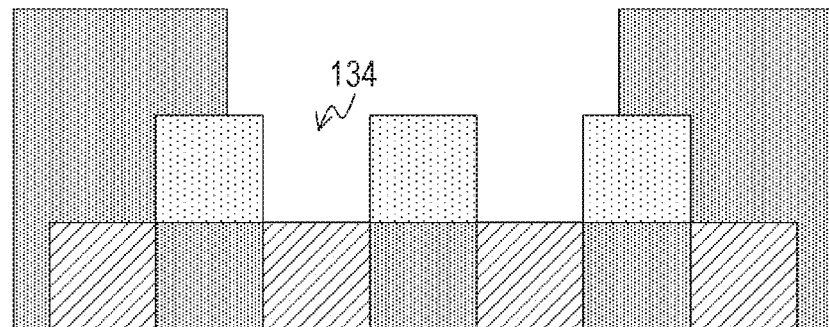
FIGS. 12A, 12B, and 12C are diagrams illustrating an example of a manufacturing method of a pad according to the second embodiment of the present technology.
Figure 12B:
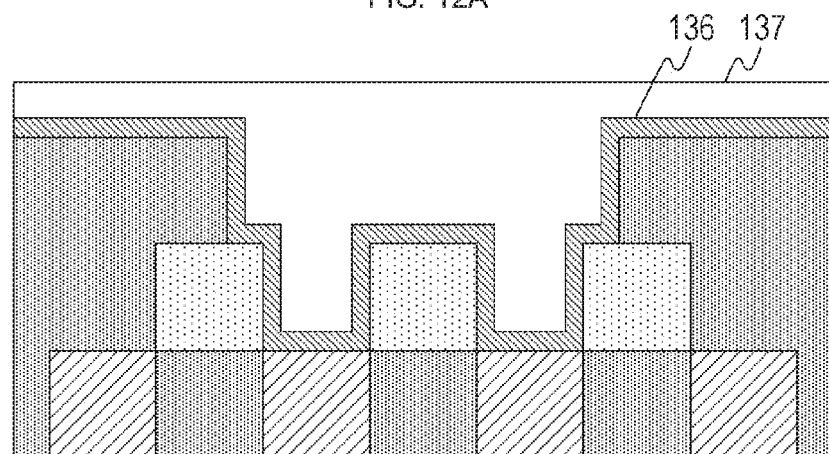
Figure 12C:
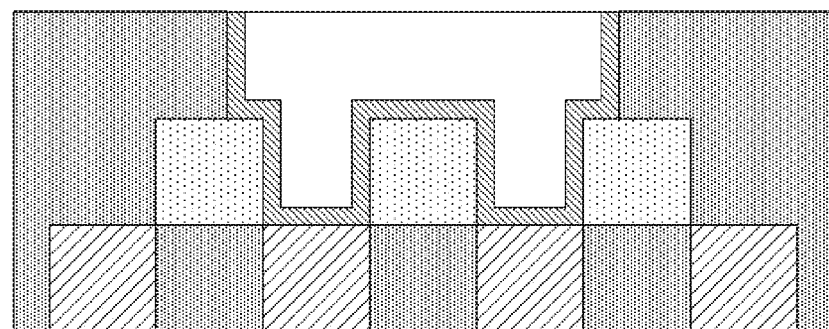

Then, the insulating layer 141 is formed (FIG. 11B), and a resist 318 having the same shape as that of the opening 101 is formed (FIG. 11C). Then, dry etching is performed, and the concave portion 134 is formed at the pad 131 (FIG. 12A). Then, the diffusion layer 136 and the melting layer 137 are sequentially formed through sputtering (FIG. 12B). Finally, grinding is performed through CMP to planarize the surface of the melting layer 137 and remove the diffusion layer 136 and the melting layer 137 disposed in a region other than the opening 101 (FIG. 12C). By this means, it is possible to manufacture the pad 131 constituted with Cu. In this manner, it is possible to form the pad 131 using a plating method which is similar to the method for the wiring layer 142.

Because a configuration of the semiconductor device 10 other than this is similar to the configuration of the semiconductor device 10 described in the first embodiment of the present technology, description will be omitted.

As described above, in the semiconductor device 10 in the second embodiment of the present technology, the pad 131 is constituted with Cu and formed using a manufacturing method similar to the method for the wiring layer 142. By this means, it is possible to form the pad 131 and the wiring layer 142 using a common manufacturing method, so that it is possible to simplify the manufacturing process.

3. Third Embodiment

In the semiconductor device 10 in the first embodiment described above, two metal layers (the diffusion layer 136 and the melting layer 137) are used as an underlying metal upon solder connection. In contrast, the semiconductor device 10 in a third embodiment of the present technology is different from the semiconductor device 10 in the first embodiment in that a third metal layer is further provided.

[Configuration of Pad Portion]

Figure 13:
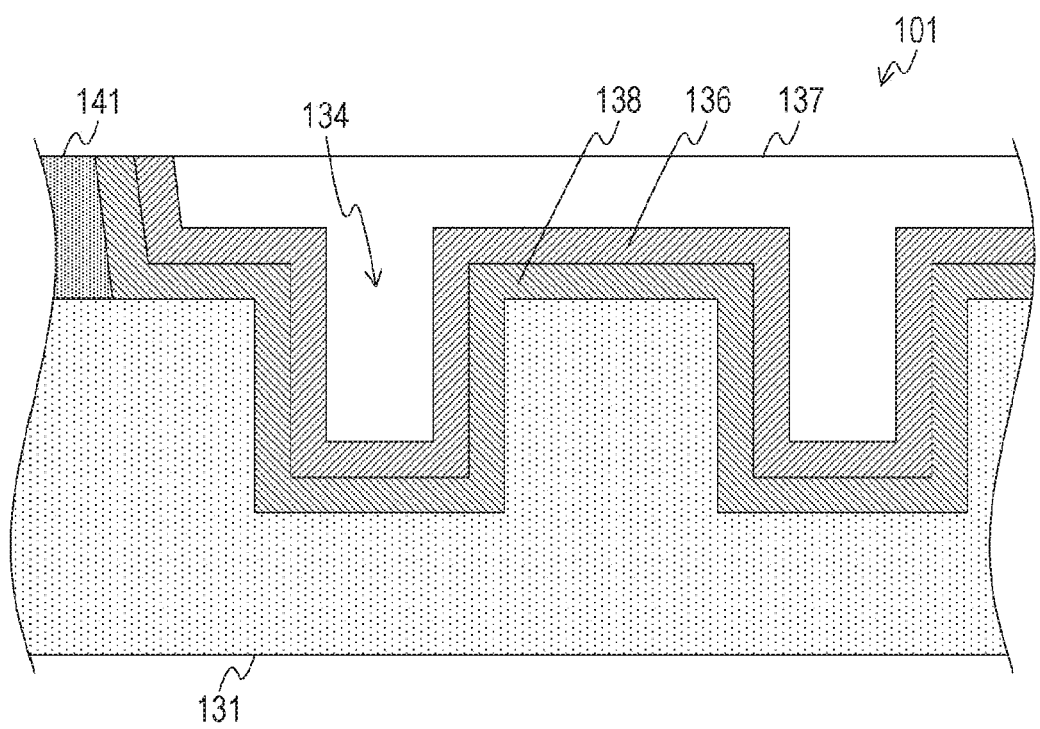
FIG. 13 is a diagram illustrating a configuration example of a pad according to a third embodiment of the present technology.

FIG. 13 is a diagram illustrating a configuration example of a pad according to a third embodiment of the present technology. FIG. 13 is a cross-sectional diagram illustrating a configuration example of the pad 131. The pad 131 in FIG. 13 is different from the pad 131 described in FIG. 4 in that a diffusion prevention layer 138 is disposed on the surface of the concave portion 134.

The diffusion prevention layer 138 is disposed between the pad 131 and the diffusion layer 136, and prevents diffusion of the pad 131 into the solder bumps 201 and 202. This diffusion prevention layer 138 is constituted with a metal which does not cause diffusion into the solder bump 201, or the like, which is molten upon solder connection. Therefore, it is possible to prevent contact between an alloy of solder and the metal constituting the diffusion layer 136, and the pad 131 upon solder connection, so that it is possible to protect the pad 131 from molten solder, or the like. Further, by disposing the diffusion prevention layer 138 between the pad 131 and the diffusion layer 136, it is possible to improve adhesion strength between the pad 131 and the underlying metal. As this diffusion prevention layer 138, for example, titanium (Ti), titanium nitride (TiN), tantalum (Ta) and tantalum nitride (TaN) can be used.

Further, it is preferable to constitute the diffusion prevention layer 138 by sequentially laminating Ti and TiN on the surface of the pad 131. Ti has relatively high adhesion strength with Al, or the like, which constitute the pad 131. Meanwhile, because an oxide film is easily formed on a surface of Ti, adhesion strength with the diffusion layer 136 becomes relatively lower. In contrast, because TiN is chemically stable, by successively forming a Ti layer and a TiN layer through sputtering, it is possible to improve adhesion strength between the pad 131 and the diffusion prevention layer 138, and between the diffusion prevention layer 138 and the diffusion layer 136. Note that it is possible to realize a configuration of Ta+TaN by sequentially laminating Ta and TaN on the surface of the pad 131 in a similar manner.

Because a configuration of the semiconductor device 10 other than this is similar to the configuration of the semiconductor device 10 described in the first embodiment of the present technology, description will be omitted.

As described above, in the semiconductor device 10 in the third embodiment of the present technology, by disposing the diffusion prevention layer 138 between the pad 131 and the diffusion layer 136, it is possible to improve adhesion strength between the pad 131 and the underlying metal while protecting the pad 131.

4. Modified Example

While, in the semiconductor device 10 in the first embodiment described above, the concave portion 134 in a net shape is formed on the pad 131, it is also possible to form the concave portion 134 having other shapes.

[Configuration of Pad Portion]

FIGS. 14A, 14B, 14C, and 14D are diagrams illustrating a configuration example of a pad according to a modified example of the embodiments of the present technology. FIGS. 14A and 14B are top views illustrating a configuration example of the pad 131, and FIGS. 14C and 14D are cross-sectional diagrams illustrating a configuration example of the pad 131.

The pad 131 in FIG. 14A includes the concave portion 134 in a circular shape. Further, this concave portion 134 is constituted in a shape of a concentric circle. Further, FIG. 14B illustrates an example where the pad 131 has the concave portion 134 which is constituted in an octagon shape which is the same as the shape of the opening 101. In this manner, by simplifying the shape of the concave portion 134, it is possible to simplify manufacturing of the pad 131.

The pad 131 in FIGS. 14C and 14D are constituted to have a cross-section in a tapered shape. The pad 131 in FIG. 14C is constituted have a cross-section in a forward tapered shape. Therefore, it is possible to easily form the pad 131. Meanwhile, the pad 131 in FIG. 14D is constituted to have a cross-section in an inverse tapered shape. It is possible to suppress peeling of the solder bumps 201 and 202 after solder connection, so that it is possible to improve strength.

5. Application Example to Imaging Device

The present technology can be applied to various semiconductor devices. For example, the present technology can be applied to the above-described imaging device. A detailed configuration of the imaging device to which the present technology is applied will be described.

Figure 15:
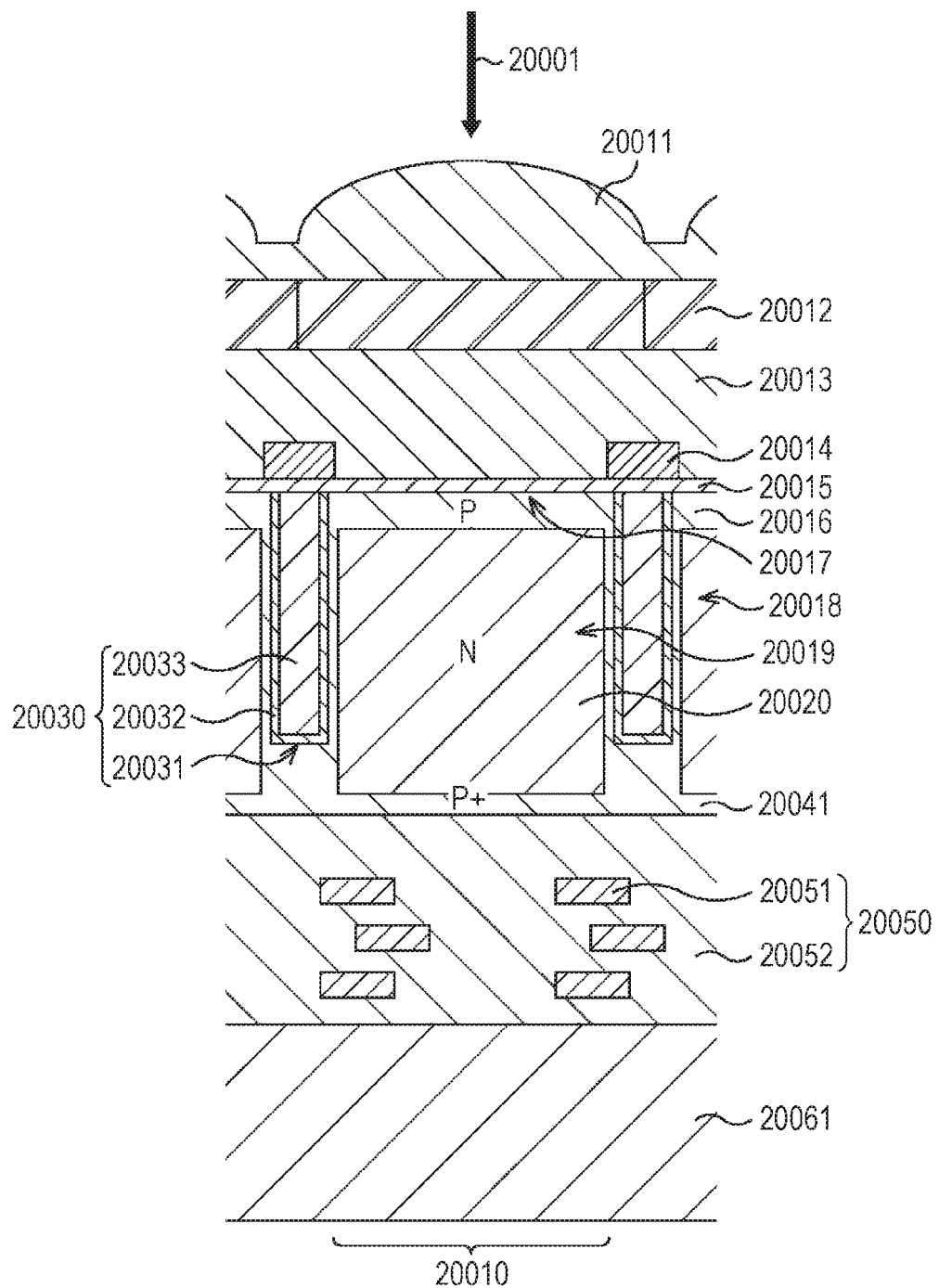
FIG. 15 is a cross-sectional diagram illustrating a configuration example of an imaging device to which the present technology can be applied.

FIG. 15 is a cross-sectional diagram illustrating a configuration example of an imaging device to which the present technology can be applied. FIG. 15 is a diagram illustrating a detailed configuration example of the pixel array unit 110 of the imaging device (semiconductor device 10) described in FIG. 1b.

In the solid-state imaging apparatus, a photodiode (PD) 20019 receives incident light 20001 that enters from the back side (top side in the drawing) of a semiconductor substrate 20018. A planarizing film 20013, a color filter (CF) 20012, and a microlens 20011 are provided above the PD 20019, a light receiving surface 20017 receives the incident light 20001 sequentially passing through each of the above-mentioned components to perform photoelectric conversion.

For example, the PD 20019 has an n-type semiconductor region 20020 formed as a charge storage region that stores electrical charges (electrons). In the PD 20019, the n-type semiconductor region 20020 is located inside p-type semiconductor regions 20016 and 20041 of the semiconductor substrate 20018. In the n-type semiconductor region 20020, provided on the surface side (underside) of the semiconductor substrate 20018 is the p-type semiconductor region 20041 with a higher concentration of impurities than on the back side (top side). In other words, the PD 20019 is configured as an HAD (Hole-Accumulation Diode) structure. On the top side and the underside of the n-type semiconductor region 20020, the p-type semiconductor regions 20016 and 20041 are formed respectively to suppress the generation of a dark current.

Inside the semiconductor substrate 20018 is a pixel separating section 20030 that electrically separates multiple pixels 20010. The PD 20019 is located in a region partitioned by the pixel separating section 20030. In a case where the solid-state imaging apparatus is viewed from the top side in the drawing, the pixel separating section 20030 is interposed, for example, between the multiple pixels 20010 to form a grid-like pattern. The PD 20019 is located in a grid region partitioned by the pixel separating section 20030.

The anode of each PD 20019 is grounded. In the solid-state imaging apparatus, the signal charge (e.g., electrons) accumulated in the PD 20019 is read via a transfer Tr (MOS FET) or the like, not depicted, and output as an electrical signal onto a vertical signal line (VSL), not depicted.

A wiring layer 20050 is provided on that opposite surface (underside) of the semiconductor substrate 20018 which is opposite to the back side (top side) where each of the components such as a light blocking film 20014, the CF 20012, and the microlens 20011 are located.

The wiring layer 20050 includes wiring 20051 and an insulating layer 20052. In the insulating layer 20052, the wiring 20051 is formed so as to connect electrically with each element. The wiring layer 20050 constitutes a so-called multilayer wiring layer in which an interlayer dielectric film making up the insulating layer 20052 and the wiring 20051 are alternately layered multiple times. Here, the wiring 20051 is constituted by wires connected with Trs for reading the electrical charges from the PD 20019 of the transfer Tr or the like and by wires such as VSLs, the wires being layered with the insulating layer 20052 interposed therebetween.

A support substrate 20061 is provided on that side of the wiring layer 20050 which is opposite to the side where the PD 20019 is located. For example, a silicon semiconductor that is hundreds of μm thick constitutes the support substrate 20061.

The light blocking film 20014 is provided on the back side (top side in the drawing) of the semiconductor substrate 20018.

The light blocking film 20014 is configured to partially block the incident light 20001 that enters from above the semiconductor substrate 20018 and continues back side of the semiconductor substrate 20018.

The light blocking film 20014 is provided above the pixel separating section 20030 located inside the semiconductor substrate 20018. Here, the light blocking film 20014 is configured in such a manner as to protrude through an insulating film 20015 such as a silicon oxide film onto the back side (top side) of the semiconductor substrate 20018. On the upper side of the PD 20019 in the semiconductor substrate 20018, by contrast, the light blocking film 20014 is not provided so that the incident light 20001 enters the PD 20019 through an aperture.

That is, in a case where the solid-state imaging apparatus is viewed from the top side, the light blocking film 20014 forms a plane in a grid-like pattern. The apertures are thus formed that allow the incident light 20001 to continue toward the light receiving surface 20017.

The light blocking film 20014 includes a light blocking material that blocks light. For example, the light blocking film 20014 is formed by alternately layering a titanium (Ti) film and a tungsten (W) film. Alternatively, the light blocking film 20014 may be formed, for example, by alternately layering a titanium nitride (TiN) film and a tungsten (W) film.

The light blocking film 20014 is covered with the planarizing film 20013. The planarizing film 20013 is formed by use of an insulating material that lets light pass through.

The pixel separating section 20030 includes a groove section 20031, a fixed charge film 20032, and an insulating film 20033.

On the back side (top side) of the semiconductor substrate 20018, the fixed charge film 20032 is formed to cover the groove section 20031 that partitions multiple pixels 20010.

Specifically, the fixed charge film 20032 is provided in a manner covering the internal surface of the groove section 20031 with a constant thickness, the groove section 20031 being formed on the back side (top side) of the semiconductor substrate 20018. In addition, the insulating film 20033 is provided to fill (pack) the inside of the groove section 20031 covered with the fixed charge film 20032.

Here, the fixed charge film 20032 is formed by use of a high dielectric material that has negative fixed charges for suppressing the generation of a dark current from a positive charge (hole) storage region formed in an interface portion with the semiconductor substrate 20018. With the fixed charge film 20032 formed to carry negative fixed charges, the negative fixed charges apply an electric field to the interface with the semiconductor substrate 20018, thereby forming the positive charge (hole) storage region in the interface.

The fixed charge film 20032 may be formed, for example, using a hafnium oxide film ($HfO_2$ film), for example. Alternatively, the fixed charge film 20032 may be formed, for example, to include at least one of such oxide elements as hafnium, zirconium, aluminum, tantalum, titanium, magnesium, yttrium, lanthanoid, or the like.

The present technology can thus be applied to the imaging device described above.

6. Application Example to Endoscopic Surgery System

A technology (present technology) according to an embodiment of the present disclosure can be applied to various products. For example, the technology according to an embodiment of the present disclosure may be applied to an endoscopic surgery system.

Figure 16:
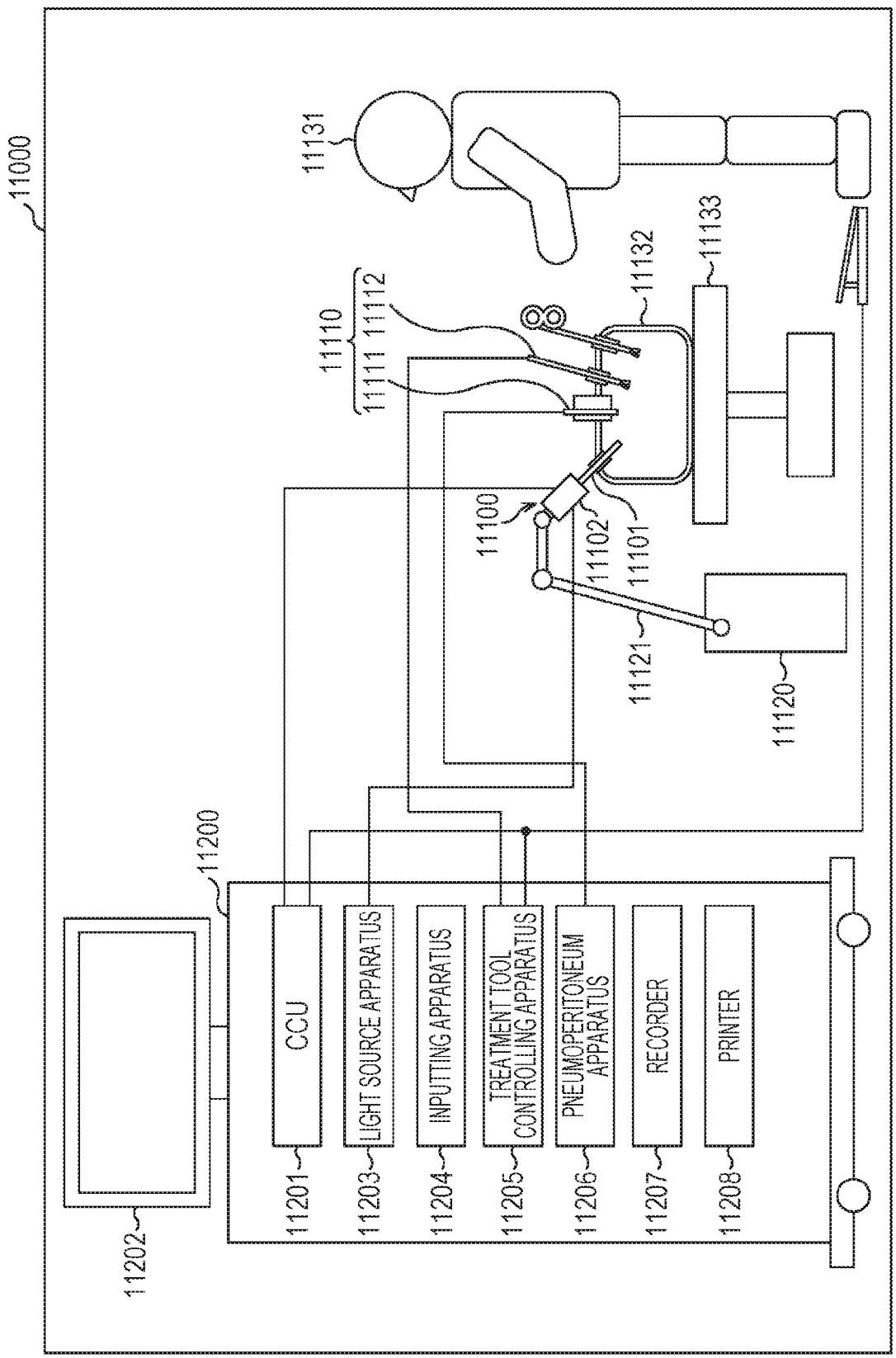
FIG. 16 is a view depicting an example of a schematic configuration of an endoscopic surgery system.

FIG. 16 is a view depicting an example of a schematic configuration of an endoscopic surgery system to which the technology according to an embodiment of the present disclosure (present technology) can be applied.

In 10, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which is included as a rigid endoscope having the lens barrel 11101 of the hard type. However, the endoscope

11100 may otherwise be included as a flexible endoscope having the lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region and the like to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or the like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the imaging elements of the camera head 11102 are controlled in synchronism with the irradiation timings, it is also possible to time-divisionally capture images corresponding to respective R, G and B. According to the method just described, a color image can be obtained even if a color filter is not provided for the imaging element.

Further, the light source apparatus 11203 may be controlled such that the intensity of light to be outputted is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrower wavelength band in comparison with irradiation light upon ordinary observation (namely, white light), so-called narrow band light observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue, for example. The light source apparatus 11203 can be configured to supply such narrow-band light and/or excitation light suitable for special light observation as described above.

Figure 17:
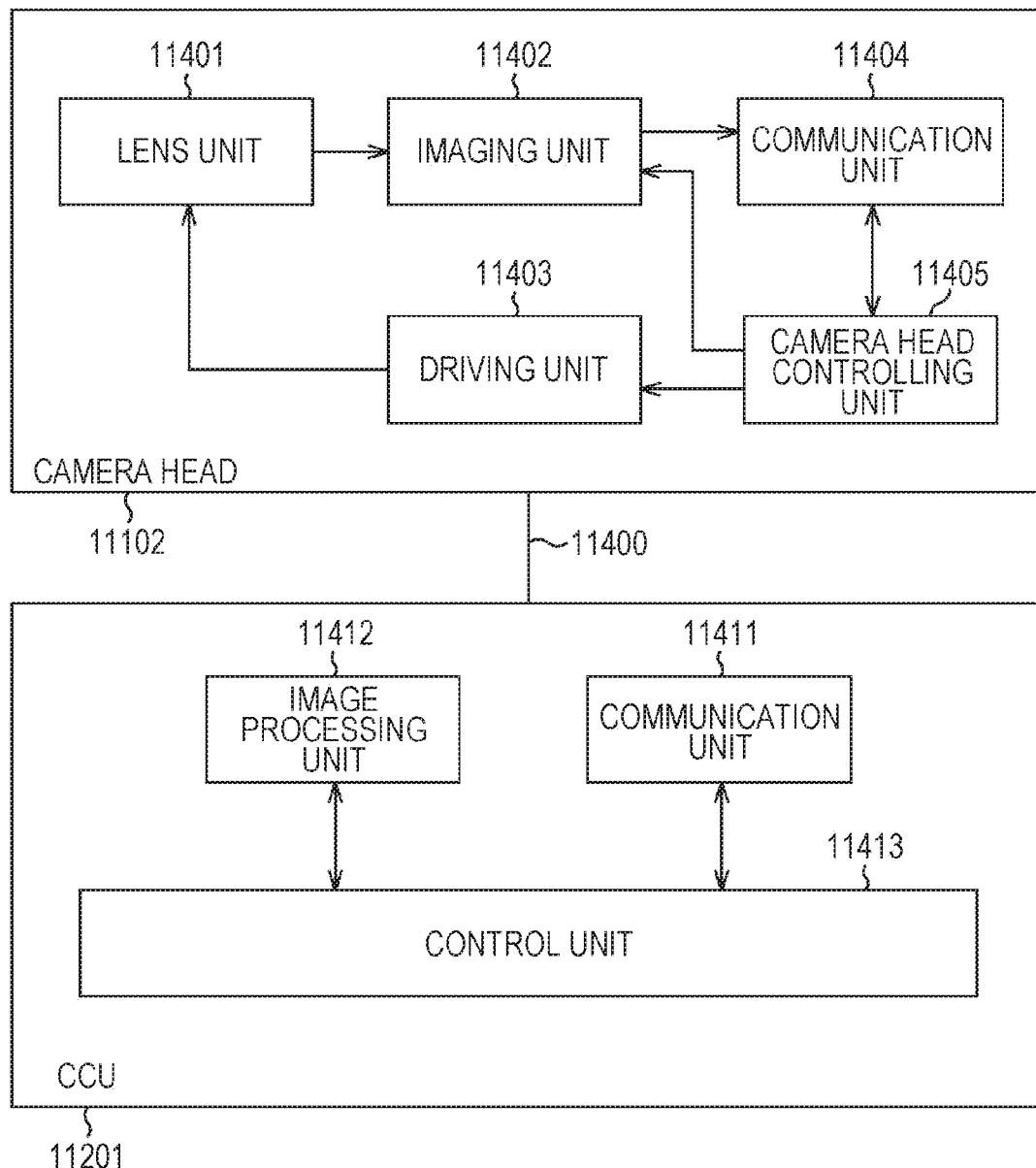
FIG. 17 is a block diagram depicting an example of a functional configuration of a camera head and a camera control unit (CCU).

FIG. 17 is a block diagram depicting an example of a functional configuration of the camera head 11102 and the CCU 11201 depicted in FIG. 16.

The camera head 11102 includes a lens unit 11401, an imaging unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 includes imaging elements. The number of imaging elements which is included by the imaging unit 11402 may be one (so-called single-plate type) or a plural number (so-called multi-plate type). Where the imaging unit 11402 is configured as that of the multi-plate type, for example, image signals corresponding to respective R, G and B are generated by the imaging elements, and the image signals may be synthesized to obtain a color image. The imaging unit 11402 may also be configured so as to have a pair of imaging elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, in a case where the imaging unit 11402 is configured as that of multi-plate type, a plurality of systems of lens units 11401 is provided corresponding to the individual imaging elements.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the imaging unit 11402 can be adjusted suitably.

The communication unit 11404 includes a communication apparatus for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to imaging conditions such as, for example, information by which a frame rate of a picked up image is designated, information by which an exposure value upon image picking up is designated and/or information by which a magnification and a focal point of a picked up image are designated.

It is to be noted that the image pickup conditions such as the frame rate, exposure value, magnification or focal point may be appropriately designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above description describes an example of an endoscopic surgery system to which the technology according to the present disclosure can be applied. The technology according to the present disclosure can be applied to the imaging unit 11402 of the camera head 11102 of the constituent elements described above. Specifically, the semiconductor device 10 in FIG. 1 can be applied to the imaging unit 10402, for example. By applying the technology according to the present disclosure to the imaging unit 10402, it is possible to improve connection strength in solder connection, so that it is possible to constitute an endoscopic surgery system having high reliability.

Note that, here, an endoscopic surgery system is described as an example, but the technology according to the present disclosure may be applied to other systems such as a microsurgery system, for example.

7. Application Example to Mobile Object

A technology (present technology) according to an embodiment of the present disclosure can be applied to various products. For example, the technology according to the present disclosure may also be realized as a device mounted in a mobile object of any type such as automobile, electric vehicle, hybrid electric vehicle, motorcycle, bicycle, personal mobility, airplane, drone, ship, or robot.

Figure 18:
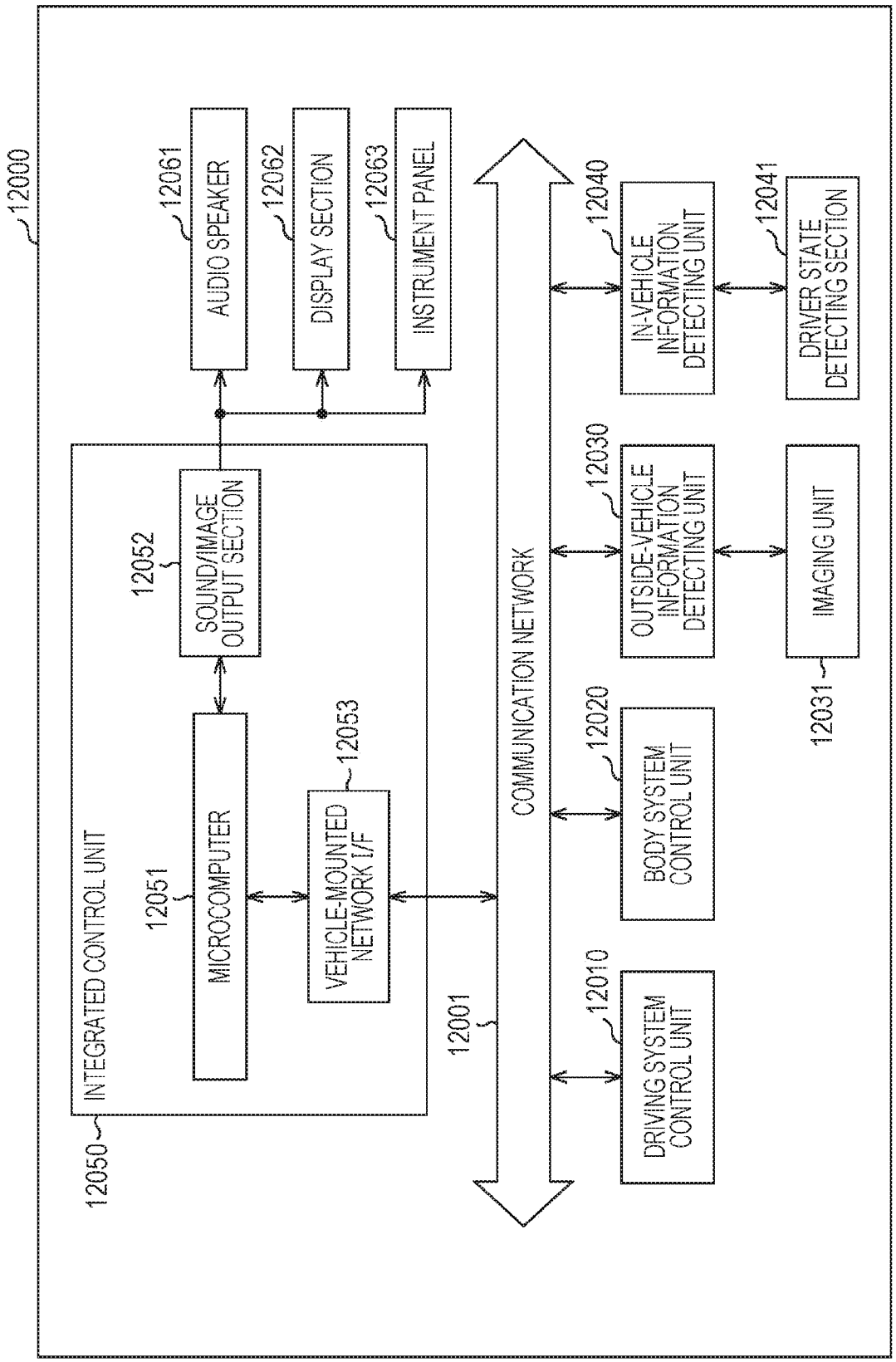
FIG. 18 is a block diagram depicting an example of schematic configuration of a vehicle control system.

FIG. 18 is a block diagram depicting an example of schematic configuration of a vehicle control system as an example of a mobile object control system to which the technology according to an embodiment of the present disclosure can be applied.

The vehicle control system 12000 includes a plurality of electronic control units connected to each other via a communication network 12001. In the example depicted in FIG. 18, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the surroundings of the vehicle which is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 18, an audio speaker 12061, a display section 12062, and an instrument panel 12063 are illustrated as the output device. The display section 12062 may, for example, include at least one of an on-board display and a head-up display.

Figure 19:
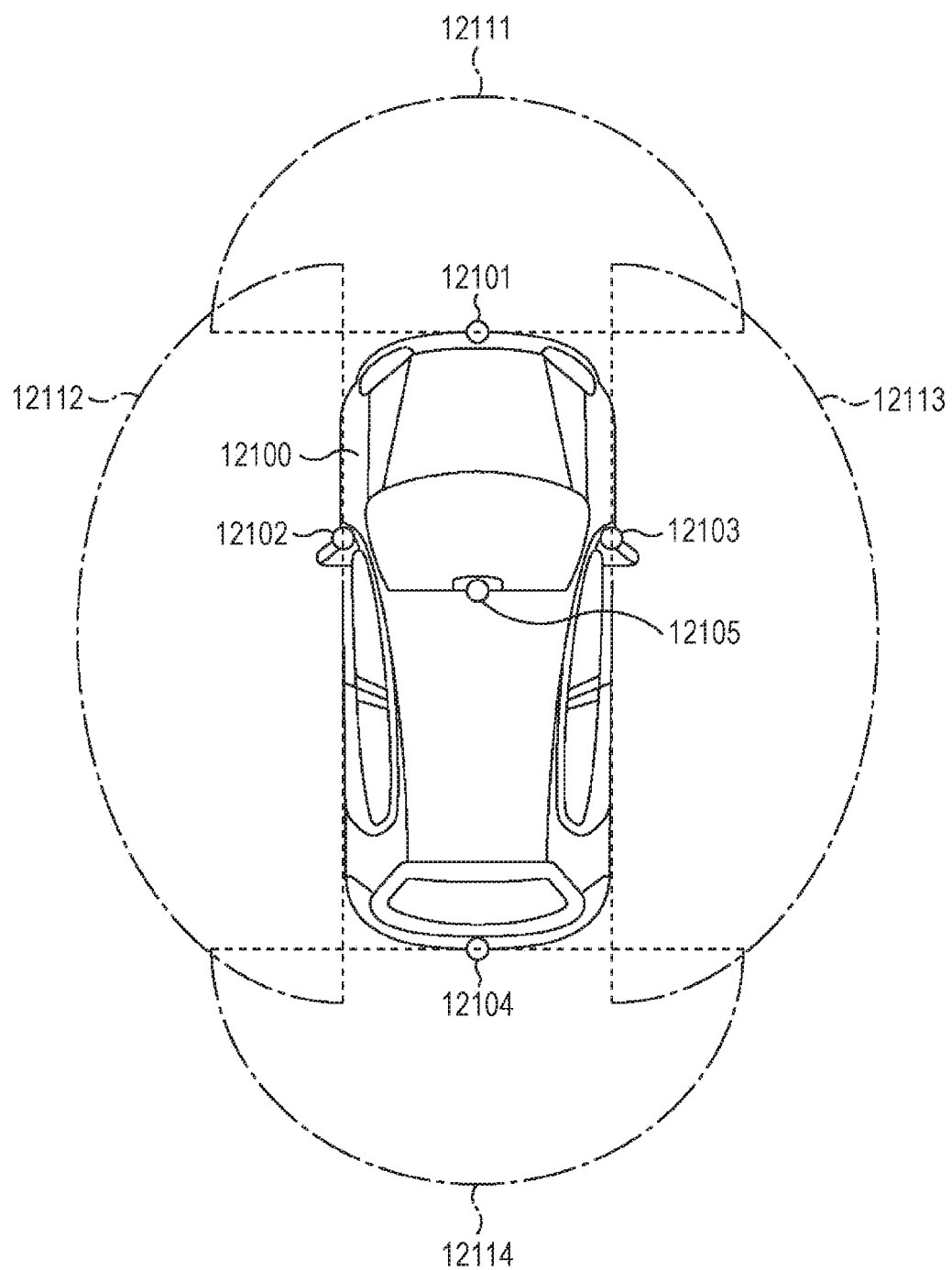
FIG. 19 is a diagram of assistance in explaining an example of installation positions of an outside-vehicle information detecting section and an imaging unit.

FIG. 19 is a diagram depicting an example of the installation position of the imaging unit 12031.

In FIG. 19, the vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The images of the front obtained by the imaging units 12101 and 12105 are used mainly to detect a preceding vehicle, a pedestrian, an obstacle, a signal, a traffic sign, a lane, or the like.

Incidentally, FIG. 19 depicts an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging units 12101 to 12104, and thus recognizes the pedestrian, the sound/image output section 12052 controls the display section 12062 so that a square contour line for emphasis is displayed so as to be superimposed on the recognized pedestrian. In addition, the sound/image output section 12052 may also control the display section 12062 so that an icon or the like representing the pedestrian is displayed at a desired position.

The above description describes an example of a vehicle control system to which the technology according to the present disclosure can be applied. The technology according to the present disclosure may be applied to the imaging unit 12031 or the like among the configurations described above. Specifically, the semiconductor device 10 in FIG. 1 can be applied to the imaging units 12031 and 12101 to 12105. By applying the technology according to the present disclosure to the imaging unit 12031, or the like, it is possible to improve connection strength in solder connection, so that it is possible to constitute a vehicle control system having high reliability.

Finally, the description of each of the embodiments described above is an example of the present technology, and the present technology is not limited to the embodiments described above. Therefore, of course, various modifications are able to be made according to the design or the like as long as the modifications do not depart from the technical spirit according to the present technology, even if the modifications are other than each of the embodiments described above.

Additionally, the present technology may also be configured as below.

(1) A semiconductor device including:

a pad including a concave portion on a surface, and at which solder connection is to be performed;

a diffusion layer disposed at the concave portion and constituted with a metal which remains on the surface of the pad while diffusing into solder upon the solder connection; and a melting layer disposed adjacent to the diffusion layer and constituted with a metal which diffuses and melts into the solder upon the solder connection.

(2) The semiconductor device according to (1), further including:

a diffusion prevention layer disposed between the pad and the diffusion layer and constituted with a metal which prevents diffusion of the pad into the solder upon the solder connection, in which the diffusion layer remains on a surface of the diffusion prevention layer upon the solder connection.

(3) The semiconductor device according to (1) or (2), in which the pad includes a plurality of the concave portions constituted in a linear shape.

(4) The semiconductor device according to any one of (1) to (3), in which the pad is constituted with aluminum.

(5) The semiconductor device according to any one of (1) to (3), in which the pad is constituted with copper.

(6) The semiconductor device according to any one of (1) to (5), in which the diffusion layer is constituted with cobalt.

(7) The semiconductor device according to any one of (1) to (6), in which the melting layer is constituted such that a plane different from a plane adjacent to the diffusion layer, has a flat planar shape.

(8) A manufacturing method of a semiconductor device including:

a concave portion forming step of forming a concave portion on a surface of a pad at which solder connection is to be performed;

a diffusion layer forming step of forming a diffusion layer constituted with a metal which remains on the surface of the pad while diffusing into solder upon the solder connection, at the formed concave portion; and a melting layer forming step of forming a melting layer constituted with a metal which diffuses and melts into the solder upon the solder connection, adjacent to the formed diffusion layer.

REFERENCE SIGNS LIST

10 Semiconductor device
100 Pixel chip
101 Opening
110 Pixel array unit
111, 213 Semiconductor substrate
121, 141 Insulating layer
122, 142, 143 Wiring layer
131 to 133, 231 Pad
134 Concave portion
136 Diffusion layer
137 Melting layer
138 Diffusion prevention layer
200 Signal processing chip
201, 202 Solder bump
10402, 12031, 12101 to 12105 imaging unit

The invention claimed is:

1. A semiconductor device, comprising:
a wiring layer;
a pad on the wiring layer, wherein
the pad includes a plurality of concave portions on a surface of the pad,
a shape of the wiring layer is same as a shape of the plurality of concave portions, and
the pad is for a solder connection; and
a diffusion layer at the plurality of concave portions, wherein
the diffusion layer comprises a first metal, and
the diffusion layer is configured to remain on the surface of the pad based on the solder connection.

2. The semiconductor device according to claim 1, further comprising a melting layer adjacent to the diffusion layer, wherein the melting layer comprises a second metal, and
the melting layer is configured to diffuse and melt into solder based on the solder connection.

3. The semiconductor device according to claim 2, further comprising a diffusion prevention layer between the pad and the diffusion layer, wherein
the diffusion prevention layer comprises a third metal configured to prevent diffusion of the pad into the solder based on the solder connection, and
the diffusion layer is further configured to remain on a surface of the diffusion prevention layer based on the solder connection.

4. The semiconductor device according to claim 2, wherein a surface of the melting layer has a flat planar shape.

5. The semiconductor device according to claim 1, wherein the plurality of concave portions has a linear shape.

6. The semiconductor device according to claim 1, wherein the plurality of concave portions has an octagon shape.

7. The semiconductor device according to claim 1, wherein the pad comprises aluminum.

8. The semiconductor device according to claim 1, wherein the pad comprises copper.

9. The semiconductor device according to claim 1, wherein the diffusion layer comprises cobalt.

10. A manufacturing method of a semiconductor device, comprising:
forming a wiring layer,
forming a pad on the wiring layer,
forming a plurality of concave portions on a surface of a pad, wherein
a shape of the wiring layer is same as a shape of the plurality of concave portions, and
the pad is for a solder connection; and
forming a diffusion layer at the plurality of concave portions, wherein
the diffusion layer comprises a first metal, and
the diffusion layer is configured to remain on the surface of the pad based on the solder connection.

11. The manufacturing method according to claim 10, further comprising forming a melting layer adjacent to the diffusion layer, wherein
the melting layer comprises a second metal, and
the melting layer is configured to diffuse and melt into solder based on the solder connection.

* * * * *